United States Patent [19]
Shoda et al.

[11] Patent Number: 5,635,738
[45] Date of Patent: Jun. 3, 1997

[54] INFRARED SOLID-STATE IMAGE SENSING APPARATUS

[75] Inventors: Masahiro Shoda, Gyoda; Keiichi Akagawa, Kamakura; Tetsuya Tomofuji, Kawasaki, all of Japan

[73] Assignee: Nikon Corporation, Tokyo, Japan

[21] Appl. No.: 360,079

[22] Filed: Dec. 20, 1994

[30] Foreign Application Priority Data

| Dec. 21, 1993 | [JP] | Japan | 5-321568 |
| Apr. 12, 1994 | [JP] | Japan | 6-073534 |
| Aug. 11, 1994 | [JP] | Japan | 6-189137 |

[51] Int. Cl.$^6$ .......................... H01L 27/148; H01L 29/68
[52] U.S. Cl. .......................... 257/225; 257/218; 257/219; 257/220; 257/221; 257/224; 257/227
[58] Field of Search .......................... 257/218, 219, 257/220, 221, 222, 223, 224, 227, 230, 232, 242, 243, 443, 445, 215, 216, 444, 912

[56] References Cited

U.S. PATENT DOCUMENTS 4,488,038  12/1984  Harrison et al. .......................... 250/211 J

FOREIGN PATENT DOCUMENTS

| 61-95566 | 5/1986 | Japan | 257/220 |
| 62-39056 | 2/1987 | Japan . | |
| 4-167470 | 6/1992 | Japan . | |
| 4-225562 | 8/1992 | Japan | 257/218 |

OTHER PUBLICATIONS

Cohen et al, "Investigation of Semiconductor Schottky Barriers for Optical Detection and Cathodic Emission," Air force Cambridge Research Labs., Nov. 15, 1967.

Akagawa et al, "A 401K Pixel PtSi Schottky-barrier Infrared CCD Image Sensor," ITE Technical Report, vol. 18, No. 17, pp. 7-12, Mar. 1994.

*Primary Examiner*—Mahshid D. Saadat
*Assistant Examiner*—Jhihan B. Clark
*Attorney, Agent, or Firm*—Shapiro and Shapiro

[57] ABSTRACT

An infrared solid-state image sensing apparatus is provided with a plurality of photoelectric converting sections arranged vertically and horizontally in a matrix pattern on a semiconductor substrate of a first conducting type; a plurality of vertical CCDs which have first buried channels of a second conducting type and electrodes disposed thereon with an insulating film between and which are disposed adjacently to the photoelectric converting sections; and a horizontal CCD having a second buried channel of the second conducting type and electrodes disposed thereon with an insulating film between and which is disposed adjacently to one side of the vertical CCDs. The first and second buried channels are provided with a low-concentration region having a uniform diffusion depth. Further, the surface of each first buried channel is provided with a high-concentration region of the second conducting type having a higher concentration than that of the surface of the second buried channel.

17 Claims, 15 Drawing Sheets

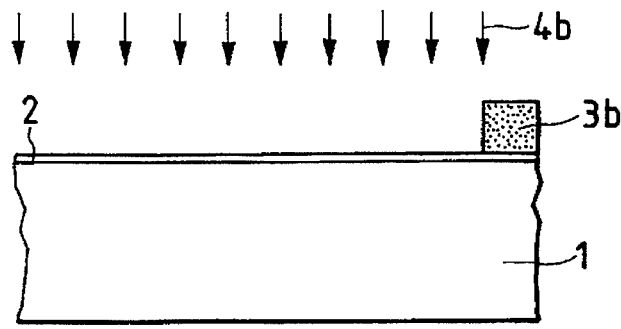
FIG. 8A
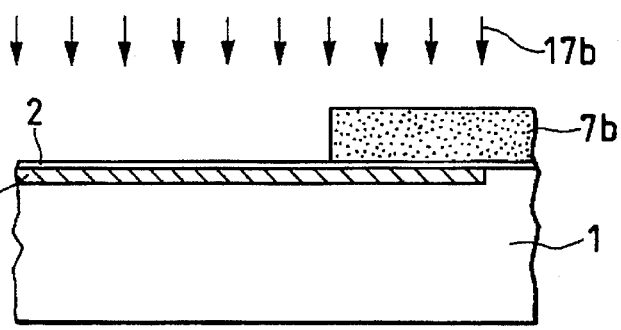
FIG. 8B
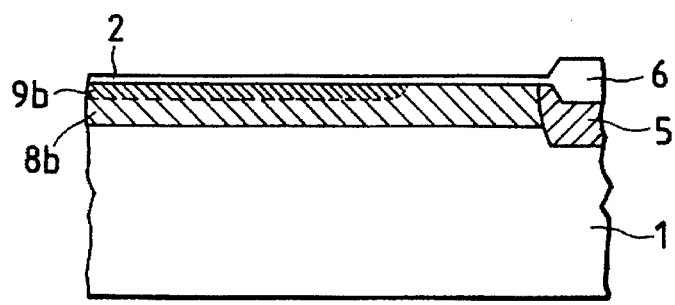
FIG. 8C
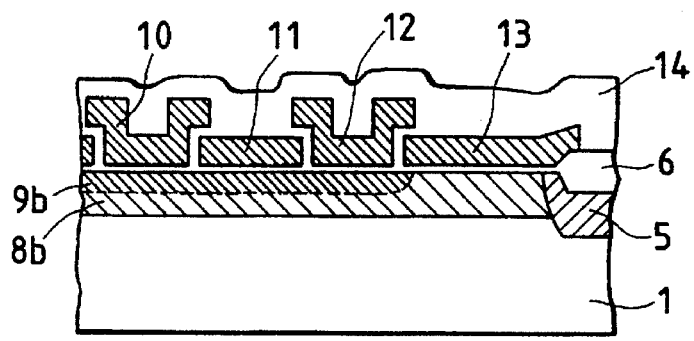
FIG. 8D
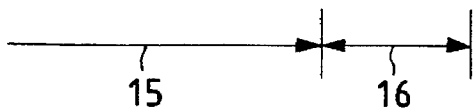

INFRARED SOLID-STATE IMAGE SENSING APPARATUS

BACKGROUND OF THE INVENTION

1. Field of the Invention

The present invention relates to an infrared solid-state image sensing apparatus and a manufacturing method therefor.

2. Related Background Art

A solid-state image sensing device, which has a plurality of picture elements comprised of photoelectric converting sections and charge transfer sections, is used not only for an industrial video camera but also extensively used for a consumer video camera. The photoelectric converting section has a different structure, depending on the type of light to be sensed. The charge transfer section is generally constituted by a charge coupled device (CCD) although some charge transfer sections are configured by wiring as in MOS solid-state image sensing devices.

An early CCD was a surface channel type wherein signal charges are transferred along the surface of a semiconductor substrate. This type of CCD was advantageous in that it was capable of transferring a large number of signal charges, but it was disadvantageous in that it had low transfer efficiency (the rate at which signal charges can be transferred without losing them). This disadvantage made this type undesirable for the solid-state image sensing device which has more than 350,000 picture elements and which is extensively used today. To solve the problem, a buried channel type CCD was developed. The buried channel type CCD uses, as the charge transferring passage, a region where an impurity of the opposite conducting type (the second conducting type) from that of the semiconductor substrate (the first conducting type) has been diffused (buried channel). With reverse bias applied between the aforesaid region and the semiconductor substrate, the voltage applied to a transfer electrode, which is disposed on the buried channel with an insulating film between, is changed gradually to store signal charges in the buried channel located apart from the surface of the semiconductor substrate, then the stored signal charges are transferred. The buried channel type CCD is ideally used for a solid-state image sensing device having many picture elements because it provides high transfer efficiency, although it can transfer fewer signal charges.

The following describes a conventional solid-state image sensing device which is used at room temperature to sense visible light (hereinafter referred to as "room temperature visible solid-state image sensing device"). FIG. 16 shows a conceptual top plan view of the room temperature visible solid-state image sensing device which is interline transfer type. Photoelectric converting sections 18 are disposed vertically and horizontally in a matrix pattern on a substrate. Adjoining the photoelectric converting sections, a plurality of vertical CCDs 19 are disposed to transfer signal charges, which have been photoelectrically converted through the photoelectric converting sections 18, in a vertical direction. One end of each vertical CCD 19 is connected to a horizontal CCD 20 which transfers the signal charges from the vertical CCD 19 in the horizontal direction. The positional relationship between the vertical and horizontal directions is relative; therefore, the directions mentioned here may be reversed by, for example, reversing the orientation of the device. Generally, however, a CCD adjoining the photoelectric converting section is called a vertical CCD and a CCD that transfers the signal charges from the vertical CCD is called a horizontal CCD. This commonly used nomenclature of these CCDs will be used throughout the present description.

Each CCD is provided with a buried channel, which is the opposite conducting type (second conducting type) from that of the substrate, and a transfer electrode (not shown) disposed on the buried channel with an insulating film between. The signal charges generated in the photoelectric converting section 18 are transferred in sequence by changing the voltage applied to the electrodes in sequence. The buried channel of the vertical CCD 19 (hereinafter referred to as "the first buried channel") and the buried channel of the horizontal CCD 20 (hereinafter referred to as "the second buried channel") are formed at the same time to simplify the process. The diffusion depth is 0.6 µm or less for the solid-state image sensing device with more than 350,000 picture elements which is commonly used these days.

The driving method for the CCDs will now be described. The 4-phase driving method is usually employed for the vertical CCD 19 and the 2-phase driving method for the horizontal CCD 20 in order to improve the performance of the solid-state image sensing device and also to permit easier manufacture. In the 4-phase driving method, four transfer electrodes constitute one group, and four different pulses, which are different in time series, are applied to the respective transfer electrodes, then potential wells formed under the transfer electrodes are moved to transfer signal charges. In the 2-phase driving method, two different types of pulses are used to transfer signal charges. In general, these pulse signals are applied to two transfer electrodes to define the transfer direction of signal charges. Further, different heights are used for the potential wells formed under the two transfer electrodes. Thus, four transfer electrodes apparently constitute one group as in the case of the 4-phase driving method.

In recent years, the solid-state image sensing devices are not only used for image sensing in the visible region but also for image sensing in the infrared region as infrared solid-state image sensing devices which are expected to find a wide range of application fields including various industrial measurement, monitoring, medical treatment, space, and defense. In the infrared solid-state image sensing device, the photoelectric converting section 18 is formed by platinum silicide (PtSi) Schottky junction; the photoelectric converting section converts infrared rays into signal charges. The obtained signal charges are transferred to the vertical CCD 19 and the horizontal CCD 20 in sequence and read out. Specifically, the infrared solid-state image sensing devices directly employ the CCDs of the room temperature visible solid-state image sensing device without adding any change and they replace the photoelectric converting section 18 with a structure which enables them to sense infrared rays.

The following describes a conventional infrared solid-state image sensing apparatus in conjunction with the accompanying drawings. The infrared solid-state image sensing apparatus is defined as a Schottky type infrared solid-state image sensing apparatus. FIG. 17 gives a cross-sectional view of a Schottky-junction photoreceptor (photoelectric converting section) 76 and a charge reading section (charge transfer section) 77 in the conventional infrared solid-state image sensing apparatus. The photoreceptor 76 is comprised of a Schottky junction 64 of a silicon substrate 61 and a metallic silicide layer 63a. Specific materials for the metallic silicide layer include platinum silicide, palladium silicide, and iridium silicide. The metallic silicide layer 63a is formed by attaching metal to the silicon substrate 61 by evaporation and heat treatment, thereby producing chemical reaction between the silicon and the metal. At the same time when the metallic silicide layer 63a is formed, the Schottky junction 64 is formed on the interface between the silicon substrate 61 and the metallic silicide layer 63a. The Schottky junction 64 is usually surrounded by a guard ring 65 which controls the electric field intensity around the Schottky junction 64 to prevent leakage currents.

The charge reading section 77 adjoining the photoreceptor 76 is disposed on the silicon substrate 61. The charge reading section 77 is composed of a gate diffusion section 66 and a buried channel 68 which are regions where impurities have been diffused, and a transfer gate electrode 67 and a transfer electrode 69 which are disposed thereon with a silicon oxide film 70 between. The gate diffusion section 66 adjoins the guard ring 65, and the buried channel 68 is disposed adjacently to the gate diffusion section 66. Disposed on the gate diffusion section 66 and the buried channel 68 are the transfer gate electrode 67 and the transfer electrode 69, and the silicon oxide film 70 intervenes therebetween.

A reflection film 73 is generally disposed on the photoreceptor with an inter-layer insulating film 72 between which reflection film reflects infrared rays, which have been transmitted without being photoelectrically converted through the Schottky junction 64, and directs them into the Schottky junction 64 again, thus improving the sensitivity. A channel stop 75 is provided to prevent signal charges from leaking. The surface of the infrared imaging apparatus is covered with a protective film 74 to improve durability.

Infrared rays 71 entering through the rear surface of the silicon substrate 61 are photoelectrically converted by the Schottky junction 64 into signal charges which are stored in the photoreceptor 76. When voltage is applied to the transfer gate electrode 67, the stored signal charges are transferred to the buried channel 68 through the gate diffusion section 66. Applying voltage to a plurality of transfer electrodes 69 arranged vertically to the paper surface causes the signal charges to be transferred in sequence.

For the substrate, a silicon substrate and other semiconductor substrate made of germanium, etc. is used. The metal used for producing the Schottky junction differs according to the material of the substrate used. In the case of a germanium substrate, such metals as platinum, palladium, and iridium are used as in the case of the silicon substrate.

The infrared solid-state image sensing device is usually cooled to approximately the temperature of liquid nitrogen (77 kelvin) when it is used. The infrared solid state image device which is cooled for use is called "cooled infrared solid-state image sensing apparatus", which, for brevity, is referred to as an IR solid-state image sensing apparatus in this description.

A conventional IR solid-state image sensing apparatus, which is cooled to about the temperature of liquid nitrogen when it is used, posed a problem of low transfer efficiency of CCDs. There was also a problem known as "blooming" which refers to a phenomenon wherein, when a hot object is imaged and displayed as an image on a CRT or the like, the hot object is displayed larger than the actual size thereof (especially the lower side of the image). As a result, the hot object is distorted when it is displayed, making the image difficult to be seen.

The conventional IR solid-state image sensing apparatus suffered from another shortcoming in that the sensitivity of photoreceptors varied greatly, requiring the correction of signals to control the variation in the sensitivity of the photoreceptors.

SUMMARY OF THE INVENTION

Accordingly, it is an object of the present invention to provide an infrared solid-state image sensing apparatus which has improved transfer efficiency of a horizontal CCD and an increased charge handling capacity of vertical CCDs.

It is another object of the present invention to provide an infrared solid-state image sensing apparatus which has less variation in the sensitivity of photoreceptors.

To these ends, according to a first aspect of the present invention, there is provided an infrared solid-state image sensing apparatus equipped with a plurality of photoelectric converting sections arranged vertically and horizontally in a matrix pattern on a first conducting type semiconductor substrate; a plurality of vertical CCDs which have first buried channels of a second conducting type and electrodes disposed thereon with insulating film between and which are disposed adjacently to the photoelectric converting sections; and a horizontal CCD which has a second buried channel of the second conducting type and electrodes disposed thereon with insulating film between, and which is disposed adjacently to one side of the vertical CCDs; the first and second buried channels being provided with a low-concentration region having a uniform diffusion depth, and the surface of each first buried channel being provided with a second conducting type, high-concentration region which has a higher concentration than that of the surface of the second buried channel.

The diffusion depth of the low-concentration region which is common to the first and second buried channels should range from 0.8 µm to 1.5 µm. The high-concentration region should extend to a part of the second buried channel. Further, the length of the extension of the high-concentration region to a part of the second buried channel should be equal to the length of the lateral diffusion produced by the thermal diffusion method.

According to a second aspect of the present invention, there is provided a method for manufacturing an infrared solid-state image sensing apparatus in accordance with the first aspect of the present invention, the method including a process for preparing the first conducting type semiconductor substrate and forming the photoelectric converting sections and a process for producing the vertical and horizontal CCDs. In this method, the process for forming the vertical and horizontal CCDs includes a step (a) for producing a first resist pattern having open portions corresponding to a first region wherein the first buried channels are planned to be produced, and a second region wherein the second buried channel is planned to be produced; a first ion implantation step (b) for ion-implanting a second conducting type impurity; a step (c) for removing the first resist pattern; a step (d) for producing a low-concentration region common to the first and second buried channels by performing heat treatment; a step (e) for producing a second resist pattern having open portions corresponding to the first region; a second ion implantation step (f) for ion-implanting the second conducting type impurity; a step (g) for removing the second resist pattern; a step (h) for forming a high-concentration region on the surface of each first buried channel by performing heat treatment; and a step (i) for forming transfer electrodes.

For the first ion implantation step and/or the second ion implantation step, ion implantation performed at different acceleration energy levels may be carried out in a plurality of times.

According to a third aspect of the present invention, there is provided a method for manufacturing an infrared solid-state image sensing apparatus in accordance with the first aspect of the present invention, the method including a process for preparing the first conducting type semiconductor substrate and forming the photoelectric converting sections, and a process for producing the vertical and horizontal CCDs. In this method, the process for forming the vertical and horizontal CCDs includes a step (a) for producing a first resist pattern having open portions corresponding to a first region wherein the first buried channels are planned to be produced, and a second region wherein the second buried channel is planned to be produced; a step (b) for first ion implantation wherein ion implantation of the second conducting type impurity is performed once or more at a higher acceleration energy level than the acceleration energy level in a second ion implantation step to be carried out later; a step (c) for removing the first resist pattern; a step (d) for producing a second resist pattern having open portions corresponding to the first region; a step (e) for second ion implantation for ion-implanting the second conducting type impurity once or more at a lower acceleration energy level than the maximum acceleration energy level in the first ion implantation step; a step (f) for removing the second resist pattern; a step (g) for forming a low-concentration region common to the first and second buried channels and also the high-concentration region on the surface of each first buried channel at the same time by performing heat treatment; and a step (h) for forming transfer electrodes.

The steps from (d) for producing the second resist pattern to (f) for removing the second resist pattern may be carried out before the step (a) for producing the first resist pattern.

According to a fourth aspect of the present invention, there is provided a method for manufacturing an infrared solid-state image sensing apparatus in accordance with the first aspect of the present invention, the method including a process for preparing the first conducting type semiconductor substrate and forming the photoelectric converting sections, and a process for producing the vertical and horizontal CCDs. In this method, the process for forming the vertical and horizontal CCDs includes a step (a) for producing a first resist pattern having open portions corresponding to a first region wherein the first buried channels are planned to be produced, and a second region wherein the second buried channel is planned to be produced; a step (b) for first ion implantation wherein ion implantation of the second conducting type impurity is performed once or more by using ions of a larger diffusion constant than that of ions to be used in a second ion implantation step to be carried out later; a step (c) for removing the first resist pattern; a step (d) for producing a second resist pattern having open portions corresponding to the first region; a step (e) for second ion implantation for ion-implanting the second conducting type impurity once or more by using ions of a smaller diffusion constant than that of the ions used in the first ion implantation step; a step (f) for removing the second resist pattern; a step (g) for forming a low-concentration region common to the first and second buried channels and also the high-concentration region on the surface of each first buried channel at the same time by carrying out heat treatment; and a step (h) for forming transfer electrodes.

The steps from (d) for producing the second resist pattern to (f) for removing the second resist pattern may be carried out before the step (a) for producing the first resist pattern.

According to a fifth aspect of the present invention, there is provided a method for manufacturing an infrared solid-state image sensing apparatus in accordance with the first aspect of the present invention, the method including a process for preparing the first conducting type semiconductor substrate and forming the photoelectric converting sections, and a process for producing the vertical and horizontal CCDs. In this method, the process for forming the vertical and horizontal CCDs includes a step (a) for producing a first resist pattern having open portions corresponding to a first region wherein the first buried channels are planned to be produced, and a second region wherein the second buried channel is planned to be produced; a step (b) for first ion implantation for ion-implanting a second conducting type impurity; a step (c) for removing the first resist pattern; a step (d) for producing a low-concentration region common to the first and second buried channels by carrying out heat treatment; a step (e) for producing a second resist pattern having open portions corresponding to the first region and a part of the second region connected thereto; a step (f) for second ion implantation for ion-implanting the second conducting type impurity; a step (g) for removing the second resist pattern; a step (h) for forming a high-concentration region on the surface of each first buried channel and on a part of the surface of the second buried channel by carrying out heat treatment; and a step (i) for forming transfer electrodes.

According to a sixth aspect of the present invention, there is provided a method for manufacturing an infrared solid-state image sensing apparatus in accordance with the first aspect of the present invention, the method including a process for preparing the first conducting type semiconductor substrate and forming the photoelectric converting sections, and a process for producing the vertical and horizontal CCDs. In this method, the process for forming the vertical and horizontal CCDs includes a step (a) for producing a first resist pattern having open portions corresponding to a first region wherein the first buried channels are planned to be produced, and a second region wherein the second buried channel is planned to be produced; a step (b) for first ion implantation for ion-implanting a second conducting type impurity; a step (c) for removing the first resist pattern; a step (d) for producing a low-concentration region common to the first and second buried channels by heat treatment; a step (e) for producing a transfer electrode of a horizontal CCD adjoining at least a vertical CCD; a step (f) for producing a second resist pattern which has open portions corresponding to the transfer electrode formed in the preceding step and the first region; a step (g) for second ion implantation for ion-implanting the second conducting type impurity; a step (h) for removing the second resist pattern; a step (i) for producing a high-concentration region by performing heat treatment; and a step (j) for forming the remaining transfer electrodes.

The Schottky IR solid-state image sensing device is cooled to about the temperature of liquid nitrogen (77 kelvin) when it is used; otherwise, the dark current will increase, preventing infrared rays from being detected as signals. The photoelectric converting sections and the charge transfer sections of the IR solid-state image sensing device, however, cannot be separated. Hence, the CCDs which serve as the charge transfer section as well as the photoelectric converting sections 18 (FIG. 16) are unavoidably cooled. At a temperature around 77 kelvin, the transfer efficiency of the CCDs is lower (worse) than that at room temperature. The transfer efficiency changes depending on transfer speed; it decreases as transfer speed increases.

In a CCD, if the transfer efficiency is low, a signal charge is left in a potential well formed under each transfer electrode and mixed with the next signal charge, the left (residual) signal charge constituting noise. This causes the signal-to-noise ratio, which represents the magnitude ratio of a signal to a noise, to decrease, adversely affecting the characteristics of the solid-state image sensing device. The vertical CCD 19 (FIG. 16) is operated at a lower transfer speed than the horizontal CCD 20 (FIG. 16); therefore, it does not suffer from lower transfer efficiency caused by the operation at low temperature. In contrast to the vertical CCD 19, in the horizontal CCD 20 which transfers signal charges at a higher speed than the vertical CCD 19 does, the signal-to-noise ratio is decreased, leading to deteriorated characteristics of the solid-state image sensing device.

To cope with the problem described above, the inventors prepared prototypes of IR solid-state image sensing devices and room temperature visible solid-state image sensing devices having different concentrations of impurities and different diffusion depths of the buried channel in the horizontal CCD 20 in order to evaluate the transfer efficiency. The evaluation results indicated that the transfer efficiency at low temperature heavily depends on the diffusion depth; the transfer efficiency increases as the diffusion depth of the buried channel increases. The evaluation results also revealed that the impurity concentration exerts less influence on the transfer efficiency in comparison with the diffusion depth although a lower concentration gave higher transfer efficiency as conventionally known.

The inventors also discovered that blooming is caused by a small charge handling capacity of the vertical CCD. The charge handling capacity means the maximum amount of signal charges which can be transferred. A small charge handling capacity causes a signal charge to leak out through a potential well. The leaked signal charge enters another potential well and turns into noise, causing blooming. The charge handling capacity is defined by the region of each transfer electrode, the diffusion concentration, and depth of the buried channel. It used to be generally considered that the charge handling capacity increases as the region of each transfer electrode and the diffusion concentration of the buried channel increase and the diffusion depth decreases. Accordingly, the inventors also studied the charge handling capacity of the vertical CCD. The study results showed that the charge handling capacity depends less on the depth but heavily depends on the concentration, which is just opposite from the case of the transfer efficiency. In other words, the diffusion depth of the buried channel actually does not exert significant influences on the charge handling capacity, although it was confirmed that the charge handling capacity can be increased by increasing the impurity diffusion concentration of the buried channels as it used to be known.

Unlike the solid-state image sensing device for room temperature visible light, the IR solid-state image sensing device has many charges which are produced by infrared radiation (background light) from a background which is an object of normal temperature. For this reason, it is necessary to increase the charge handling capacity for the vertical CCD 19 and the horizontal CCD 20. The photoelectric converting section 18 comprised of the PtSi Schottky junction has lower efficiency of converting light into signal charges (the same meaning as quantum efficiency or sensitivity) than the photoelectric converting section 18 for visible light which generally uses a silicon PN junction. The sensitivity can be generally increased by increasing the area of the photoelectric converting section 18. The IR solid-state image sensing device should be made smaller, however, because of the restrictions from the manufacturing process and the restrictions from the optical system including lenses. Hence, the area of the photoelectric converting section 18 is decreased. Further, the area of the photoelectric converting section 18 must be made smaller to increase the resolution of the IR solid-state image sensing device.

To cope with the conflicting requirements, usually, the ratio of the area of each picture element of the IR solid-state image sensing device to the area of the photoelectric converting section 18 in each picture element (this ratio is called "fill factor") is increased. In order to increase the fill factor, the area occupied other than by the photoelectric converting section 18 in a picture element must be minimized. Accordingly, the width of the transfer passage of the vertical CCD 19 (the width of the first buried channel) must be made narrow. On the other hand, as it is obvious from FIG. 16, the horizontal CCD 20 is not involved in the picture element; therefore, it is allowed to take an ample width of the buried channel of the horizontal CCD 20 (the second buried channel), being free from the restrictions mentioned above. In other words, the charge handling capacity of the horizontal CCD 20 can be increased by increasing the area thereof, but this method cannot be applied to the charge handling capacity of the vertical CCD 19. As a result, the charge handling capacity of the IR solid-state image sensing device is restricted by the vertical CCD 19, leading to the occurrence of the blooming. Thus, the charge handling capacity is proportional to the transfer passage width of the CCD, and therefore, the width of the buried channel of the CCD needs to be increased. As mentioned above, however, because of the restriction on the fill factor, the vertical CCD 19 must be designed to increase the charge handling capacity, while at the same time minimizing the width of the first buried channel.

It is known that the charge handling capacity of the CCD can be increased by increasing the concentration of the impurity of the buried channel. Hence, the inventors made IR solid-state image sensing devices having different impurity concentrations and diffusion depths of the buried channel of the vertical CCD 19 to evaluate the charge handling capacity thereof. The results revealed that, in contrast to the transfer efficiency, the charge handling capacity depends less on the diffusion depth but it heavily depends on the impurity concentration. Thus, it was found that the charge handling capacity of the vertical CCD 19 in the IR solid-state image sensing device can be increased by increasing the impurity concentration of the first buried channel.

The above description may be summarized as follows. The problems are (1) the low transfer efficiency of the horizontal CCD 20, and (2) small charge handling capacity of the vertical CCD 19. The low transfer efficiency of the horizontal CCD 20 can be improved by decreasing the impurity concentration of the second buried channel and increasing the diffusion depth. The small charge handling capacity of the vertical CCD 19 can be improved by increasing the impurity concentration of the first buried channel. Accordingly, for the IR solid-state image sensing device used at low temperature, it is important to establish appropriate producing conditions separately for the buried channel of the horizontal CCD 20 and for the buried channel of the vertical CCD 19.

In the case of the room temperature visible solid-state image sensing device, first and second buried channels, which are separately formed, are disclosed in Japanese Patent Application Laid-Open No. 62-39056 (hereinafter referred to as "the prior art"). This prior art refers to the improvement in the narrow channel width effect in the vertical CCD. According to the narrow channel width effect, when the width of the first buried channel, which is the second conducting type, is set to 2 µm or less, the lateral diffusion from the high-concentration diffusion region of the first conducting type for channel cut formed under an isolated oxide film causes the concentration of the buried channel to decrease, leading to a drop in the potential of the vertical CCD. The following is a direct quotation from the description of the prior art: "Different conditions for producing the buried channels are used for the vertical transfer section (vertical CCD) and the horizontal transfer section (horizontal CCD). Preferably, the buried channel of the vertical transfer section (vertical CCD) is made shallower than the buried channel of the horizontal transfer section (horizontal CCD). Further, the impurity concentration of the buried channel of the vertical transfer section (vertical CCD) is made higher than that of the horizontal transfer section (horizontal CCD). The depth (junction depth) of the n-type diffusion layer which will serve as the buried channel of the vertical transfer section (vertical CCD) is made smaller than that of the horizontal transfer section (horizontal CCD); therefore, the narrow channel width effect can be controlled in the vertical transfer section (vertical CCD) to compensate for the drop in the potential." There is further description: "Only the n-type diffusion layer of the vertical transfer section (vertical CCD) is made shallow."

FIG. 18 is the cross-sectional view which illustrates the transfer section of a solid-state image sensing device in accordance with the prior art. A buried channel 155 of the first region (vertical transfer section) 95a and a buried channel 156 of the second region (horizontal transfer section) 96a are produced separately, the diffusion depth of the former being made smaller than that of the latter. Reference numerals 90 through 93 denote the electrodes formed on the transfer sections. Reference numeral 85 denotes a channel cut. The prior art is intended to improve the narrow channel width effect for the room temperature visible solid-state image sensing device; the diffusion depth of the buried channel of the vertical CCD is made smaller and the concentration thereof is increased, while maintaining the conventional diffusion depth of the buried channel of the horizontal CCD. Therefore, the prior art does not improve the transfer efficiency of the horizontal CCD of the IR solid-state image sensing device at low temperature or the charge handling capacity of the vertical CCD.

Furthermore, even when the prior art is employed in the IR solid-state image sensing device, it is still difficult to transfer signal charges from the vertical CCD to the horizontal CCD. According to the method disclosed in the prior art, the first and second buried channels are produced independently and the photolithographing process for implanting ions to the respective buried channels is carried out separately. This causes dislocation of a resist mask due to a manufacturing error, thus causing the buried channels of the vertical CCD and the horizontal CCD to be accordingly dislocated. As a result, for example, as shown in FIG. 19, a region 101, where there is no buried channel, is produced between the buried channel of the first region and the buried channel of the second region. The region 101 breaks the "passage" through which signal charges pass, making it difficult to transfer signal charges from the vertical CCD to the horizontal CCD. In contrast to this, if the first and second buried channels overlap, then a potential valley is produced because the impurity concentration increases in the region where the buried channels overlap. As a result, signal charges to be transferred are left in the potential valley, making the transfer difficult.

In the IR solid-state image sensing device in accordance with the present invention, the first buried channel and the second buried channel share the same low-concentration region. The low-concentration region is deeper than the buried channel of the room temperature visible solid-state image sensing device; the depth should range from 0.8 μm to 1.5 μm. This improves the transfer efficiency of the horizontal CCD and it also solves the problems involved in the prior art. The low-concentration region is produced by implanting ions of the opposite conducting type (the second conducting type) from that of the semiconductor substrate into the semiconductor substrate and subjecting the substrate to heat treatment. The ion implanting process for producing the low-concentration region is called the first ion implantation process. The heat treatment is performed for the semiconductor substrate to anneal out crystal defects caused by the ion implantation and to produce a predetermined distribution of impurity concentration.

Moreover, the IR solid-state image sensing device in accordance with the present invention has a high-concentration region disposed on the surface of the first buried channel to increase the charge handling capacity of the vertical CCD. As the charge handling capacity of the vertical CCD increases, more signal charges can be transferred. This enables an image of a brighter object (an image of a hot object in the infrared imaging device) to be sensed without causing blooming. If there is no need to sense the image of a bright object, then signal charges can be transferred with a smaller width of the first buried channel. Thus, the area of the photoreceptor can be increased (the fill factor can be increased), permitting improved sensitivity of the IR solid-state image sensing device. The high-concentration region is produced by implanting the second conducting type ions into the surface of the first buried channel and subjecting the substrate to heat treatment. The ion implantation process for producing the high-concentration region is called the second ion implantation process.

As previously described, the low-concentration region and the high-concentration region can be generated by implanting ions with different acceleration energy levels a plurality of times. The depth of implanted ions from the surface of the semiconductor substrate changes depending on the acceleration energy level. As the acceleration energy level increases, the ions are implanted more deeply in the semiconductor substrate. Therefore, implanting ions at different acceleration energy levels a multiple number of times allows a predetermined distribution to be formed in the low-concentration region and the high-concentration region without the need of ion diffusion by heat treatment. For this reason, the heat treatment for each region is carried out to anneal out crystal defects, thus permitting a shorter time required for the heat treatment. The ion implantation at different acceleration energy levels is conducted more than once only during the first ion implantation process or the second ion implantation process or in both processes.

As described above, setting the acceleration energy for the first ion implantation at a higher level than that for the second ion implantation simplifies the process because the heat treatment is required to be carried out only after the second ion implantation. Ion implantation may be carried out a multiple number of times during the first ion implantation and the second ion implantation, respectively. The depth at which ions are diffused in the semiconductor substrate also changes depending on the diffusion constant of ions; the greater the diffusion constant, the greater is the diffusion depth. Accordingly, if the diffusion constant of the ions used for the second ion implantation is smaller than that of the ions used for the first ion implantation, then the ions implanted first are diffused more deeply by a single heat treatment cycle. Thus, carrying out the heat treatment after the second ion implantation produces the low-concentration region and the high-concentration region at the same time, simplifying the process. Furthermore, the order of the first ion implantation and the second ion implantation may be reversed if different acceleration energy levels or ions with different diffusion constants are used for the first ion implantation and the second ion implantation.

Thus, the transfer efficiency in the horizontal CCD can be improved and the charge handling capacity in the vertical CCD can be increased. The transfer efficiency can be further improved by extending a part of the high-concentration region to the second buried channel. This will be explained with conjunction with FIG. 20. FIG. 20 shows the cross-sectional view of the IR solid-state image sensing device wherein transfer electrodes 90, 91, 92, and 93, which are formed after the buried channel, have been shifted to the right in the drawing due to a manufacturing error. This view corresponds to a cross section along line XX—XX shown in FIG. 16, and FIGS. 21A through 21C show the potential states thereof. In FIGS. 21A through 21C, the axis of ordinates gives the potential, the potential value decreasing toward the bottom. The axis of abscissa indicates position, the positions of the transfer electrodes being shown at the top of the figures. Reference numerals Q1 through Q3 denote signal charges.

In FIG. 20, disposed on the first conducting type silicon substrate (semiconductor substrate) 81 is a second conducting type buried channel of a low impurity concentration (low-concentration region) 100 which is formed common to the first buried channel (the buried channel for the vertical CCD), which corresponds to a first region 95, and the second buried channel (the buried channel for the horizontal CCD), which corresponds to a second region 96. A buried channel with high impurity concentration (high-concentration region) 110 is provided for the first buried channel.

The first buried channel involves a part 102 of the low-concentration region 100 (below the last transfer electrode 92 of the vertical CCD); the part 102 develops a high potential. FIG. 21A shows the potential state which is observed when the signal charge Q1 is stored under the transfer electrodes 90 and 91 of the vertical CCD. A part 103 with a high potential produced by the part 102 exists under the transfer electrode 92. FIG. 21B shows the potential state which is observed when the potential under the transfer electrode 92 is decreased; the signal charge Q1 is partly transferred to the horizontal CCD. Then, the potential is increased in the order of the potential under the transfer electrodes 90, under the transfer electrode 91, and under the transfer electrode 92, and the signal charge Q1 is then transferred to the horizontal CCD.

FIG. 21C shows the potential state which is observed when the potential under all the three transfer electrodes 90, 91, and 92 is raised. The signal charge Q1 is only partially transferred because of the presence of the high-potential part 103 under the transfer electrode 92, only Q3 out of the signal charges being transferred. The horizontal CCD does not get the signal charge Q2, which is not transferred. Thus, the charge transfer quantity is reduced by the amount of the charge Q2 which cannot be transferred (Q2 is no longer a signal charge). The charge Q2 then moves to a region with a lower potential where it is mixed with a signal charge to be transferred next, thus turning into noise.

Hence, taking the manufacturing error into account, it is desirable to extend a part of the high-concentration region 110 to the second buried channel. FIG. 10 shows the cross-sectional view of the IR solid-state image sensing device wherein a high-concentration region 9c has been extended to the second buried channel (Embodiment 4), the length of the extension being denoted by reference numeral 22. As a result of the extension, a part of the high-concentration region 9c overlaps with a transfer electrode 13 of the horizontal CCD with an oxide film 2 between. Therefore, there is no part 102 shown in FIG. 20.

The extension length 22 should not be very long because a lower impurity concentration improves the transfer efficiency in the buried channel (the second buried channel) of the horizontal CCD as described above. Further, overlapping the high-concentration region 9c and the transfer electrode 13 of the horizontal CCD produces a part 104 with low potential as shown in FIG. 22 and there is a danger of a signal charge being caught in the part 104. If, however, the overlapping amount, i.e., the length of the extension 22, is adjusted so that the fringing effect is obtained, then the part with low potential will disappear, leading to an even better result.

The fringing effect is an effect wherein, an electric field produced when voltage is applied to a transfer electrode of a CCD changes the potential under a transfer electrode adjacent thereto. In FIG. 10, a transfer electrode 12 of the vertical CCD adjoins a transfer electrode 13 of the horizontal CCD. For example, if the buried channel is n-type, then the application of negative (minus) voltage to the transfer electrode 12 raises the potential under the transfer electrode 13 due to the fringing effect, thus eliminating the danger mentioned above.

In the manufacturing method in accordance with the sixth aspect of the present invention, the overlapping amount, i.e., the extension length 22, is set within the range of fringing effect. This is accomplished by implementing the second ion implantation by self alignment. Self alignment refers to a diffusion region forming method which requires no ion implanting masks based on resist patterns; electrodes, oxide films or the like are used for the ion implantation masks. In this case, the transfer electrode 13 of the horizontal CCD is employed as the mask to implant ions to produce the high-concentration region. This sets the overlapping amount 22 to an amount which is equivalent to the lateral diffusion produced by the subsequent thermal diffusion. The dimension ranges from about 0.4 μm to about 0.6 μm although it varies depending on manufacturing conditions.

The photoelectric converting section according to the present invention is not limited to the platinum silicide Schottky type; it may alternatively be, for example, a Schottky type of IrSi, PdSi, or the like. Further, a photoelectric converting section which is another type than the Schottky type may be used as long as it is capable of converting infrared rays into signal charges in a cooled state. According to a seventh aspect of the present invention, there is provided an infrared solid-state image sensing apparatus constituted by a plurality of Schottky junction photoreceptors, which are disposed in a matrix pattern on a semiconductor substrate and which produce signal charges by photoelectrically converting infrared rays, and a charge reading section which adjoins the photoreceptors and which transfers the signal charges. In the infrared solid-state image sensing device, the semiconductor substrate has an epitaxial layer and the Schottky junction receptors are disposed on the epitaxial layer.

The semiconductor substrate is a silicon substrate and the Schottky junction photoreceptor is preferably comprised of a Schottky junction of a silicon epitaxial layer which is disposed on the silicon substrate and a metal silicide layer.

The metal silicide layer is preferably a platinum silicide layer.

Further, the epitaxial layer should range from 1 μm to 30 μm in thickness.

Further, the charge reading section should be a charge coupled device or a charge sweep device.

According to an eighth aspect of the present invention, there is provided an infrared solid-state image sensing apparatus equipped with a plurality of photoelectric converting sections arranged vertically and horizontally in a matrix pattern on an epitaxial layer of a semiconductor substrate comprised of a first conducting type semiconductor whereon the epitaxial layer of the same conducting type is provided; a plurality of vertical CCDs which have second conducting type first buried channels formed on the epitaxial layer and electrodes disposed thereon with an insulating film between and which are disposed adjacently to the photoelectric converting sections; and a horizontal CCD which has a second conducting type second buried channel formed on the epitaxial layer and electrodes disposed thereon with an insulating film between and which is disposed adjacently to one side of the vertical CCDs; the first and second buried channels being provided with a low-concentration region having the same diffusion depth, and the surface of each first buried channel being provided with a second conducting type, high-concentration region which has a higher concentration than that of the surface of the second buried channel.

The diffusion depth of the low-concentration region which is common to the first and second buried channels should range from 0.8 µm to 1.5 µm.

The high-concentration region should extend to a part of the second buried channel. Further, the length of the extension of the high-concentration region to a part of the second buried channel should be equal to the length of the lateral diffusion produced by the thermal diffusion method.

According to a ninth aspect of the present invention, there is provided a method for manufacturing an infrared solid-state image sensing apparatus in accordance with the eighth aspect of the present invention, the method including a process for preparing a semiconductor substrate composed of the first conducting type semiconductor whereon the same conducting type epitaxial layer is provided, and producing photoelectric converting sections, and a process for producing the vertical and horizontal CCDs. In this method, the process for forming the vertical and horizontal CCDs includes a step (a) for producing a first resist pattern having open portions corresponding to a first region wherein the first buried channels are planned to be produced, and a second region wherein the second buried channel is planned to be produced; a first ion implantation step (b) for ion-implanting a second conducting type impurity; a step (c) for removing the first resist pattern; a step (d) for producing a low-concentration region common to the first and second buried channels by carrying out heat treatment; a step (e) for producing a second resist pattern having open portions corresponding to the first region; a second ion implantation step (f) for ion-implanting an impurity of the second conducting type; a step (g) for removing the second resist pattern; a step (h) for forming a high-concentration region on the surface of each first buried channel by implementing heat treatment; and a step (i) for forming transfer electrodes.

For the first ion implantation step and/or the second ion implantation step, ion implantation may be carried out at different acceleration energy levels in a plurality of times.

As a result of the research performed by the inventors, a surprising fact was found; the variation in sensitivity described above is attributable to variation in the impurity concentration of a semiconductor substrate and crystal defects. Based on the discovery, the inventors have accomplished the present invention.

Most semiconductor substrates have variation in impurity concentration or crystal defects. The sensitivity of the photoreceptors of the infrared solid-state image sensing apparatus to light (hereinafter referred to simply as "sensitivity") varies due to the variation in the impurity concentration or crystal defects. The following describes the influences exerted by the variation in the impurity concentration in a semiconductor substrate on the sensitivity.

Quantum efficiency ψ of the Schottky junction is one of the indexes for quantitatively indicating the sensitivity. This is a ratio of signal to charge produced by photoelectric conversion of incident light; it is represented by Expression 1 as shown in a report by J. Cohen et al, Final Report Air Force Cambridge Research Lab. AFCRL-68-06510, 1968.

$$\psi = \frac{C1\,(h\nu - e\phi b)^2}{h\nu} \qquad \text{Expression 1}$$

where C1 denotes a quantum efficiency modulus which depends on the type of the Schottky junction or the structure of the photoreceptor; h denotes Planck's constant; ν denotes the frequency of incident light; e denotes the charge quantity of an electron; and φb indicates the barrier height of the Schottky junction, which is given by Expression 2:

$$e\phi b = eVbi + (E_F - E_V) \qquad \text{Expression 2}$$

where Vbi denotes the diffusion potential of the Schottky junction; and $E_F$ and $E_V$ denote the Fermi energy level and the valence band energy level, respectively, of the semiconductor material which constitutes the Schottky junction. Further, $E_F - E_V$ is given by Expression 3:

$$E_F - E_V = -\left\{ kT \cdot \ln\left(\frac{Na}{Nv}\right) \right\} \qquad \text{Expression 3}$$

where k denotes the Boltzmann's constant; T denotes the absolute temperature of the Schottky junction; Na denotes the impurity concentration in the semiconductor material; and Nv denotes the energy level density of the valence band of the semiconductor material. Expression 4 is derived from Expression 2 and Expression 3 above:

$$e\phi b = eVbi - \left\{ kT \cdot \ln\left(\frac{Na}{Nv}\right) \right\} \qquad \text{Expression 4}$$

Substituting Expression 4 for Expression 1 gives Expression 5:

$$\psi = \frac{C1\,[h\nu - eVbi + \{kT \cdot \ln(Na/Nv)\}]^2}{h\nu} \qquad \text{Expression 5}$$

where C1 and Vbi depend on the type of the Schottky junction, i.e., the semiconductor material and the metallic material forming the Schottky junction, and the structure of the photoreceptor used. Nv depends on the semiconductor material. Accordingly, the sensitivity of each photoreceptor (quantum efficiency ψ) is determined by the concentration of the impurities in the semiconductor material under the photoreceptor, provided the structure, metallic material, and semiconductor material of the photoreceptor remain the same.

There is another index, namely, cutoff wavelength λ, which quantitatively indicates the sensitivity. The cutoff wavelength is the maximum wavelength which permits photoelectric conversion. The larger the cutoff wavelength, the wider is the wavelength range of photoelectric conversion, leading to higher sensitivity. The cutoff wavelength is represented by Expression 6:

$$\lambda = \frac{hc}{e\phi b} \qquad \text{Expression 6}$$

where c denotes the light velocity. Substituting Expression 4 for Expression 6 gives Expression 7:

$$\lambda = \frac{hc}{eVbi - \{kT \cdot \ln(Na/Nv)\}} \qquad \text{Expression 7}$$

where Vbi is determined solely by the type of the Schottky junction, i.e., the semiconductor material and the metallic material forming the Schottky junction. Nv is determined by the semiconductor material. Accordingly, it is obvious also from this expression that the sensitivity (cutoff wavelength $\lambda$) depends on the concentration of the impurities in the semiconductor material.

The impurity concentration in a semiconductor substrate generally varies even in the same single substrate. If the impurity concentration in the semiconductor substrate is non-uniform in the substrate, then the sensitivity of the Schottky junction disposed on the semiconductor substrate naturally becomes non-uniform. In the infrared solid-state image sensing apparatus which has many photoreceptors, the impurity concentration of the semiconductor substrate differs among photoreceptors, resulting in great variation in the sensitivity of the respective photoreceptors.

The influences exerted by crystal defects on the sensitivity of the photoreceptors will now be described. If a photoreceptor of the infrared image sensing apparatus has a crystal defect, the sensitivity thereof deteriorates. Hence, if, for example, an infrared ray coming from a plane of the same temperature is allowed to enter a plurality of photoreceptors, then the quantity of the signal charges produced in the photoreceptors differs, depending on the presence of crystal defects. Thus, the presence of crystal defects leads to the variation in the sensitivity of the photoreceptors. A crystal defect in a semiconductor substrate is known to be caused by inter-lattice dissolved oxygen.

Thus, the conventional infrared solid-state image sensing apparatus have great variation in sensitivity among photoreceptors. The variation in sensitivity results in difficult-to-see images obtained from the signal charges from the photoreceptors. For this reason, in general, signal correction is performed to compensate for the variation in sensitivity among photoreceptors. A crystal defect in a semiconductor substrate causes an image defect such as a white scratch or black scratch. A white scratch refers to a white spot which is caused by imaged noise charges which have been produced in a great quantity in a spot having a crystal defect. A black scratch refers to a black spot which appears when the image is produced with signal charges extinguished due to a crystal defect. These video defects result in difficult-to-see images.

An epitaxial layer is a film used to grow thin-film crystal of a desired impurity concentration and of a desired thickness on substrate crystal. Usually, the same material as that of the substrate is grown as the epitaxial layer. The epitaxial layer is known to exhibit highly uniform impurity concentration and very little dissolved oxygen between lattices, i.e., very few crystal defects. The infrared solid-state image sensing apparatus in accordance with the present invention is made on a semiconductor substrate which is covered with the epitaxial layer featuring minimized variation in the impurity concentration and very few crystal defects. Thus, the infrared solid-state image sensing apparatus exhibits reduced variation in the sensitivity among the photoreceptors, producing sharp images without carrying out the signal correction to compensate for the variation in sensitivity among the photoreceptors; it also reduces the image defects such as the white scratches and the black scratches.

The epitaxial layer, however, is influenced by the semiconductor substrate. More specifically, the impurities of the semiconductor substrate are re-diffused in the epitaxial layer, and the epitaxial layer is influenced by the semiconductor substrate in a thickness of about 1 µm or less from the semiconductor substrate. Hence, if the epitaxial layer is thinner than 1 µm, then the variation in the impurity concentration of the epitaxial layer increases, failing to fulfill the purpose of the epitaxial layer provided. For this reason, the epitaxial layer must be at least 1 µm thick. More preferably, the epitaxial layer should be 2 µm or more when the manufacturing error and the like are taken into account.

If the epitaxial layer of 1 µm or more is provided, then the purpose of the provision of the epitaxial layer described above can be fulfilled. Although the upper limit value of the thickness of the epitaxial layer is not restricted, most epitaxial layers are employed in a thickness of 30 µm or less because of the limitation of an epitaxial layer producing apparatus. The epitaxial layer in the infrared solid-state image sensing apparatus preferably should be 10 µm or less, taking into account the working efficiency for producing the epitaxial layer, the manufacturing cost, and the adverse influences exerted by the epitaxial layer grown also on the rear surface of a substrate.

Variation in the impurity concentration takes place among a plurality of semiconductor substrates as well as in the same single substrate. The epitaxial layer, however, permits good reproducibility; therefore, the variation among semiconductor substrates can be reduced by providing the epitaxial layer.

Any type of semiconductor substrate may be used for the infrared solid-state image sensing apparatus as long as the Schottky junction formed on the substrate is capable of photoelectrically converting infrared rays. In most cases, however, silicon substrates are used because they allow the use of the silicon semiconductor manufacturing technology which is a commonly used art. In this case, metallic materials used for producing the Schottky junction include platinum, palladium, and iridium. These metals react with silicon to produce a metallic silicide layer. The interface, i.e., Schottky junction, between the metallic silicide layer and a silicon substrate is capable of performing the photoelectric conversion of infrared rays. Among the metallic silicides, platinum silicide produces a Schottky junction which exhibits a high cutoff wavelength with resultant high sensitivity.

The above describes the purpose and action of the epitaxial layer provided on a semiconductor substrate in relation to the infrared solid-state image sensing apparatus. The advantages of the epitaxial layer disposed on the semiconductor substrate of the infrared solid-state image sensing apparatus, however, are not limited to those described above; marked effects are recognized also in the charge reading section. More specifically, the epitaxial layer disposed on the semiconductor substrate, and a charge coupled device (CCD) or charge sweep device (CSD) disposed on the charge reading section (charge transfer section) lead to reduced crystal defects and achieve higher transfer efficiency (the rate at which signal charges can be transferred without losing them) of the charge reading section.

The CSD is a device wherein many MOS diodes are disposed and voltage is applied to a series of transfer electrodes to provide the same potential under all the transfer electrodes in order to store signal charges there ("potential wells" in a broad sense). By changing the voltage level applied to the respective transfer electrodes beginning with the transfer electrode on one end and increasing the potential level toward the transfer electrode on the other end, the charges are transferred or swept toward the electrode on the other end.

The above and other objects, features, and advantages of the present invention are explained hereinafter and may be better understood by reference to the drawings and the description which follows.

BRIEF DESCRIPTION OF THE DRAWINGS

FIGS. 8A through 8D are cross-sectional views illustrative of the manufacturing processes of an IR solid-state image sensing apparatus in accordance with a third embodiment of the present invention;

DETAILED DESCRIPTION OF THE PREFERRED EMBODIMENTS

Detailed description of the present invention will now be given in relation to a number of preferred embodiments, with reference to the accompanying drawings. The present invention, however, is not limited to the illustrative embodiments. The same top plan view as that of the conventional room temperature visible solid-state image sensing apparatus shown in FIG. 16 applies to all embodiments.

(Embodiment 1)

Figure 16:
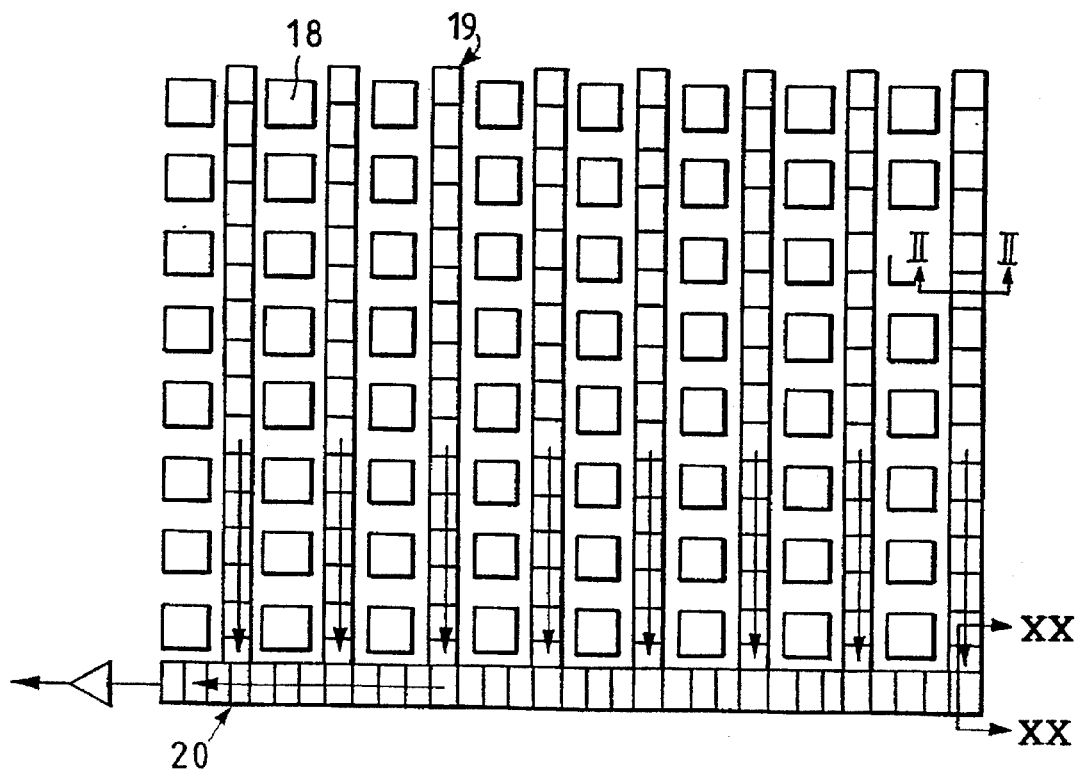
FIG. 16 is a conceptual top plan view of an interline transfer type solid-state image sensing apparatus.

FIGS. 1A through 1D are cross-sectional views illustrative of the manufacturing processes of an IR solid-state image sensing apparatus in accordance with the first embodiment of the present invention; they show the cross sections taken along a line corresponding to line XX—XX of FIG. 16. This embodiment corresponds to the manufacturing method in accordance with the second aspect of the present invention. A thin oxide film 2, which is 100 nm thick, was formed by thermal oxidation on a p-type (the first conducting type) silicon substrate (semiconductor substrate) 1 of an impurity concentration of $8\times10^{14}$ cm$^{-3}$. Then, a first resist pattern 3 was formed to cover the whole region except at open portions of the pattern corresponding to a first region 15 and a second region 16, where the first and second buried channels of the vertical and horizontal CCDs are to be formed, respectively.

Figure 1A:
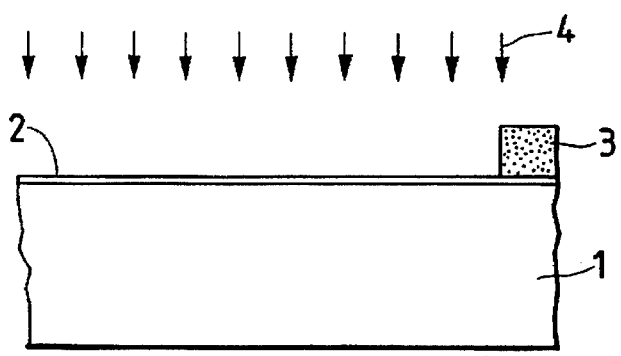
FIGS. 1A through 1D are cross-sectional views illustrative of the manufacturing processes of an IR solid-state image sensing apparatus in accordance with a first embodiment of the present invention.

In the next step, phosphorus was ion-implanted in the silicon substrate 1, using the first resist pattern 3 as a mask to produce a low-concentration region 8 which is common to the first and second buried channels. The conditions for ion implantation (4) are as follows: the implant-dosage is $1.5\times10^{12}$/cm$^2$; and the acceleration energy is 160 KeV. The phosphorus is an n-type (the second conducting type) impurity. This ion implantation process is the first ion implantation process, which is illustrated in FIG. 1A.

Figure 1B:
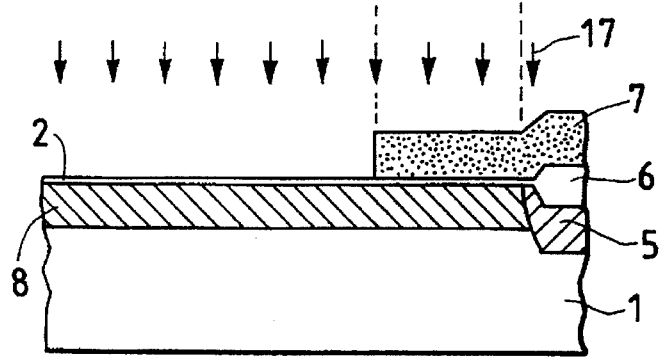

In the following step, the first resist pattern 3 was removed prior to the heat treatment performed at 1125° C. for 30 minutes in a nitrogen atmosphere. This heat treatment forms the low-concentration region 8. The diffusion depth of the low-concentration region 8 is increased by various types of heat treatment to be carried out after that. Then, using the publicly known LOCOS method, a device isolating region comprised of a channel cut 5 by p-type impurity diffusion and a thick oxide film 6 was produced. Then, a second resist pattern 7 having open portions corresponding to the first region 15 was produced. In the following step, phosphorus was ion-implanted, using the second resist pattern 7 as a mask to produce a high-concentration region 9. The conditions for ion implantation (17) are as follows: the implant-dosage is $1.5\times10^{12}$/cm$^2$; and the acceleration energy is 100 KeV. The implant-dosage is not limited thereto; it may be a different quantity as long as the concentration in the surface of the first region 15 is higher than that of the low-concentration region 8. This ion implantation process is the second ion implantation process which is illustrated in FIG. 1B.

Figure 1C:
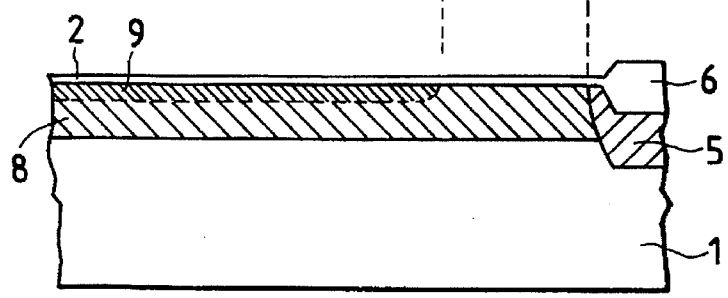
Figure 1D:
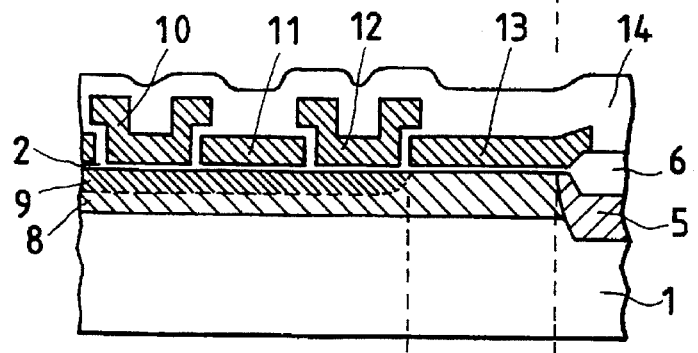
Figure 2:
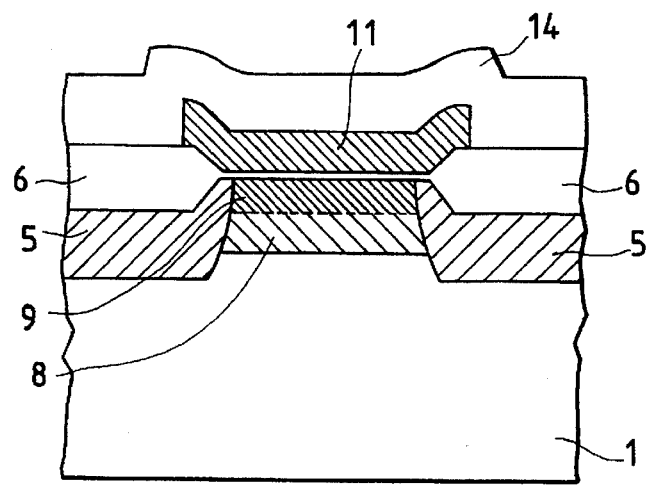
FIG. 2 is a cross-sectional view of a vertical CCD of the IR solid-state image sensing apparatus manufactured in accordance with the first embodiment.

In the next step, the second resist pattern 7 was removed prior to the heat treatment performed at 1125° C. for 2.5 minutes in the nitrogen atmosphere in order to restore the crystallinity of the surface of the silicon substrate 1 and also to activate the implanted ions. This state is illustrated in FIG. 1C. Thus, the high-concentration region 9 is formed on the surface portion of the first region 15 which corresponds to the first buried channel. Then predetermined processing was carried out to produce the transfer electrodes, namely, transfer electrodes 10 through 12 of the vertical CCD and a transfer electrode 13 of the horizontal CCD. Poly-silicon was used for all the transfer electrodes 10 through 13. Then, a photoelectric converting section 18 (FIG. 16) was formed. The photoelectric converting section 18 was provided with a PtSi Schottky junction which converts infrared rays into signal charges. Lastly, a protective film 14 was formed to complete the IR solid-state image sensing apparatus in accordance with the present embodiment (FIG. 1D). $SiO_2$ produced by chemical evaporation (CVD) was employed for the protective film 14. FIG. 2 is the cross-sectional view of a vertical CCD of the IR solid-state image sensing apparatus manufactured according to the present embodiment. The cross-sectional view corresponds to the cross section taken along line II—II of FIG. 16. Thus, the high-concentration region 9 with a high impurity concentration covers the full width of the surface of the first buried channel.

Figure 3:
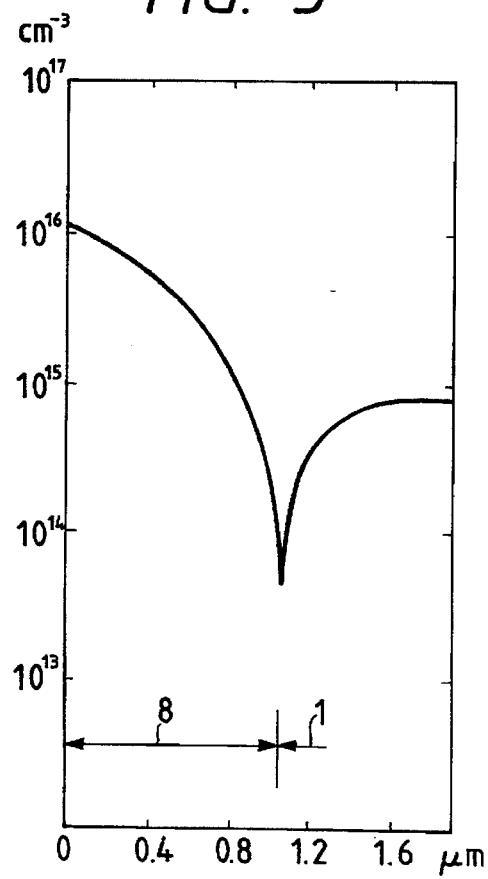
FIG. 3 shows the distribution of the impurity concentrations in the direction of depth in the second region of the apparatus manufactured in accordance with the first embodiment.

FIG. 3 shows the distribution of impurity concentrations in the direction of depth in the second region of the apparatus fabricated in the first embodiment. The axis of abscissa indicates the depth from the surface of the second region, the unit being μm; the axis of ordinates indicates the impurity concentration (the impurity concentration per 1 cubic centimeter). A part denoted by reference numeral 8 is the second buried channel and it is the low-concentration region. The second buried channel exhibits a gentle impurity distribution, the surface concentration being $1\times10^{16}/cm^3$. The impurity concentration suddenly changes at a depth of about 1 μm, indicating the position of a pn junction (the diffusion depth of the low-concentration region) between the silicon substrate 1 and the second buried channel (the low-concentration region in this case). In the present embodiment, the diffusion depth of the low-concentration region is about 1 μm. This value is about 1.6 times the value (0.6 μm) of the room temperature visible solid-state image sensing apparatus. The region denoted by reference numeral 1 is the p-type silicon substrate.

Figure 4:
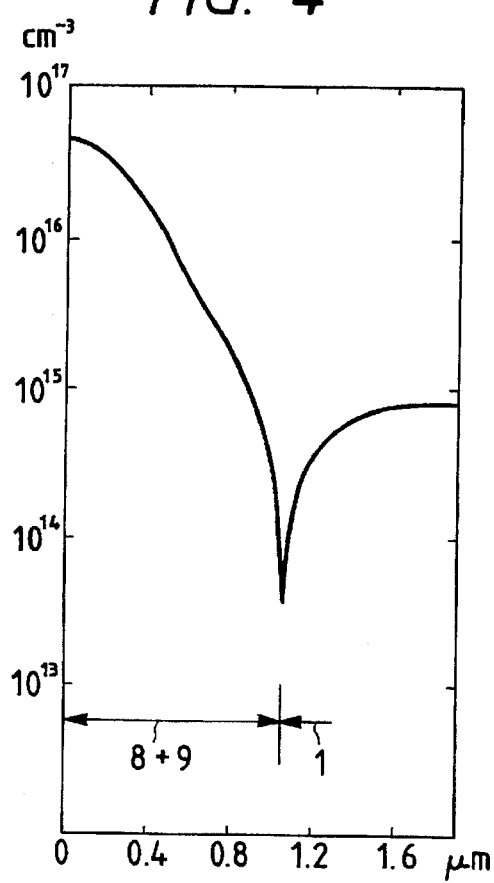
FIG. 4 shows the distribution of the impurity concentrations in the direction of depth in the first region of the apparatus manufactured in accordance with the first embodiment.

FIG. 4 shows the distribution of impurity concentrations in the direction of depth in the first region of the apparatus fabricated in the first embodiment. The axis of abscissa indicates the depth from the surface of the first region, the unit being μm; the axis of ordinates indicates the impurity concentration. A part denoted by 8+9 is the first buried channel and it is the high-concentration region disposed on the low-concentration region. The surface concentration of the first buried channel (surface concentration of the high-concentration region) is about $6\times10^{16}/cm^3$, indicating that it is higher than the surface concentration $1\times10^{16}/cm^3$ of the second buried channel. Reference numeral 1 denotes the silicon substrate 1. The pn junction between the first buried channel and the silicon substrate 1 was located at approximately 1 μm. A result of the comparison with FIG. 3 revealed that the concentration distribution was the same at depth of 0.7 μm or more. This also proves that the high-concentration region is disposed on the low-concentration region. From these facts, it is seen that the low-concentration region 8 maintains the same depth over the first buried channel and the second buried channel and the surface of the first buried channel is provided with a shallow high-concentration region 9 with a high impurity concentration which has been formed by the second ion implantation and heat treatment.

(Embodiment 2)

FIGS. 5A through 5D are cross-sectional views illustrative of the manufacturing processes of an IR solid-state image sensing apparatus in accordance with the second embodiment of the present invention; they show the cross sections taken along a line corresponding to line XX—XX of FIG. 16. This embodiment corresponds to the manufacturing method in accordance with the third aspect of the present invention. First, using the publicly known LOCOS method, a device isolating region comprised of a p-type channel cut 5 and a thick oxide film 6 was produced on a p-type silicon substrate 1 of an impurity concentration of $8\times10^{14}$ $cm^{-3}$. A thin oxide film 2, which is 100 nm thick, was formed by thermal oxidation. Then, a first resist pattern 3a was formed to cover the whole region except at open portions of the pattern corresponding to the first region 15 and the second region 16, where the first and second buried channels of the vertical and horizontal CCDs are to be produced, respectively.

In the next step, phosphorus was ion-implanted in the silicon substrate 1 at high acceleration energy three times, using the first resist pattern 3a as the mask to produce a low-concentration region 8a which is common to the first and second buried channels.

Figure 5A:
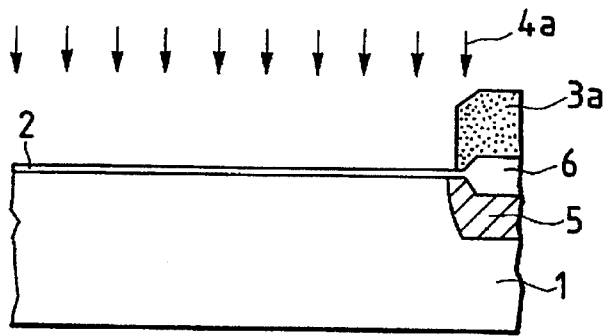
FIGS. 5A through 5D are cross-sectional views illustrative of manufacturing processes of an IR solid-state image sensing apparatus in accordance with a second embodiment of the present invention.

The conditions for ion implantation (4a) are as follows: the first ion implantation was performed at an acceleration energy level of 800 KeV with an implant-dosage of $1\times10^{11}/cm^2$; the second ion implantation was performed at an acceleration energy level of 440 KeV with an implant-dosage of $2.5\times10^{11}/cm^2$; the third ion implantation was performed at an acceleration energy level of 300 KeV with an implant-dosage of $3\times10^{11}/cm^2$. This ion implantation process is the first ion implantation process, which is illustrated in FIG. 5A. The ion implantation at high acceleration energy levels achieved deep diffusion of the low-concentration region 8a without carrying out thermal diffusion.

Figure 5B:
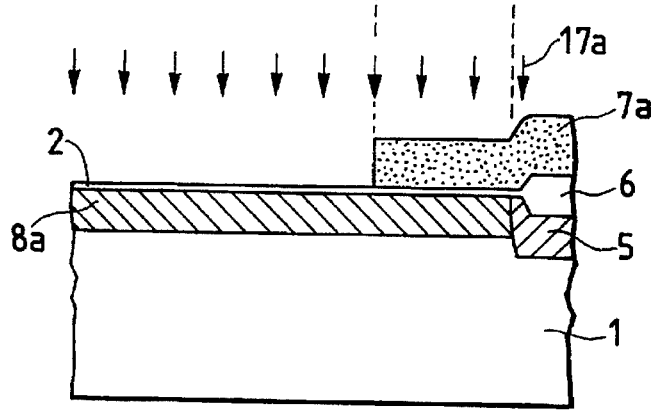

Further, the first resist pattern 3a was removed, and a second resist pattern 7a having open portions corresponding to the first region 15 was produced. In the following step, phosphorus was ion-implanted, using the second resist pattern 7a as the mask to produce a high-concentration region 9a. The ion implantation (17a) was performed twice. The conditions for the ion implantation are as follows: the first ion implantation was performed at an acceleration energy level of 150 KeV with an implant-dosage of $5\times10^{11}/cm^2$; and the second ion implantation was performed at an acceleration energy level of 100 KeV with an implant-dosage of $5\times10^{11}/cm^2$. The implant-dosage is not limited thereto; it may be a different quantity as long as the concentration in the surface of the first region 15 is higher than that of the low-concentration region 8a. This ion implantation process is the second ion implantation process, which is illustrated in FIG. 5B.

Figure 5C:
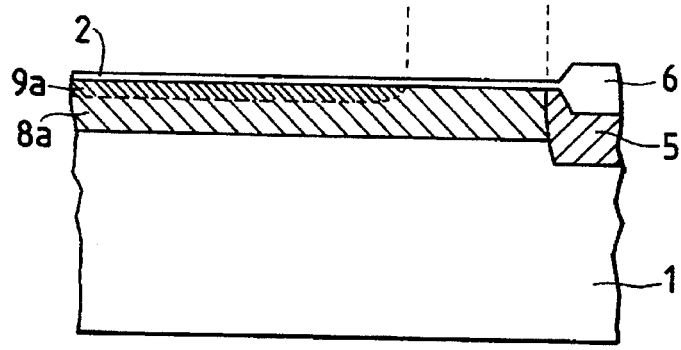
Figure 5D:
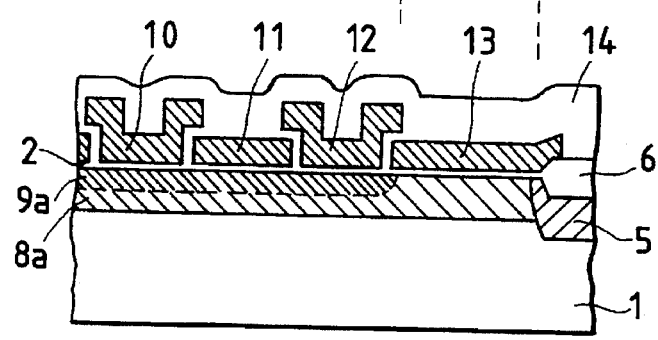

In the next step, the second resist pattern 7a was removed prior to the heat treatment performed at 1125° C. for 2.5 minutes in a nitrogen atmosphere in order to restore the crystallinity of the surface of the silicon substrate 1 and also to activate the implanted ions. Thus, the low-concentration region 8a, which is common to the first buried channel and the second buried channel, and the high-concentration region 9a on the surface of the first buried channel have been produced at the same time. This state is illustrated in FIG. 5C. Then, predetermined processing was carried out to produce the transfer electrodes, namely, the transfer electrodes 10 through 12 of the vertical CCD and the transfer electrode 13 of the horizontal CCD. Poly-silicon was used for all the transfer electrodes 10 through 13. Then, a photoelectric converting section 18 (FIG. 16) was formed. The photoelectric converting section 18 was provided with the PtSi Schottky junction which converts infrared rays into signal charges. Lastly, the protective film 14 was formed to complete the IR solid-state image sensing apparatus in accordance with the present embodiment (FIG. 5D). $SiO_2$ produced by CVD was employed for the protective film 14.

Figure 6:
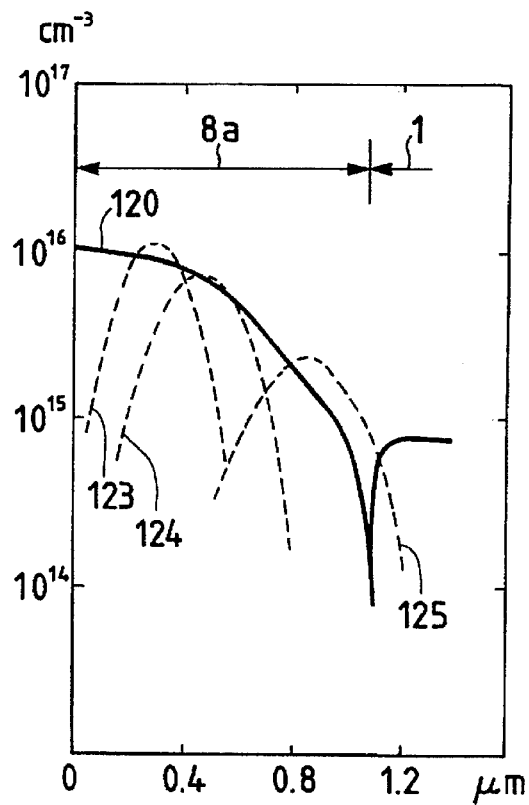
FIG. 6 shows the distributions of the impurity concentrations in the direction of depth in the second region of the second embodiment.

FIG. 6 shows the distributions of impurity concentrations in the direction of depth in the second region in the second embodiment. A dashed line 123 indicates the concentration distribution observed immediately after the ion implantation carried out at the acceleration energy of 300 KeV with the implant-dosage of $3 \times 10^{11}/cm^2$; a dashed line 124 indicates the concentration distribution observed immediately after the ion implantation carried out at the acceleration energy of 440 KeV with the implant-dosage of $2.5 \times 10^{11}/cm^2$; the dashed line 125 indicates the concentration distribution observed immediately after the ion implantation carried out at the acceleration energy of 800 KeV with the implant-dosage of $1 \times 10^{11}/cm^2$; and a solid line 120 indicates the concentration distribution of a completed apparatus. The axis of abscissa indicates the depth from the surface of the second region, the unit being μm; the axis of ordinates indicates the impurity concentration (the impurity concentration per 1 cubic centimeter). The three distributions mentioned above are merged into the distribution shown by the solid line when the apparatus is completed. A part denoted by 8a is the second buried channel and it is the low-concentration region. The second buried channel exhibits a gentle impurity distribution, the surface concentration being $1 \times 10^{16}/cm^3$. In the present embodiment, without carrying out thermal diffusion, the low-concentration region having a good depth and good concentration distribution was successfully formed by implanting ions plural times at different high energy levels. The pn junction between the second buried channel and the silicon substrate (the diffusion depth of the second buried channel) is located at about 1 μm. This value is about 1.6 times the value (0.6 μm) of the room temperature visible solid-state image sensing apparatus. The region denoted by reference numeral 1 is the p-type silicon substrate.

Figure 7:
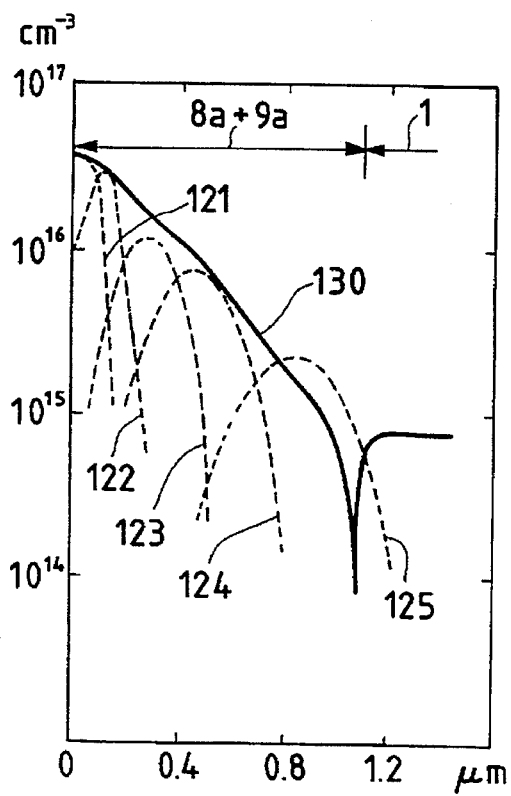
FIG. 7 shows the distributions of the impurity concentrations in the direction of depth in the first region of the second embodiment.

FIG. 7 shows the distributions of impurity concentrations in the direction of depth in the first region in the second embodiment. The dashed lines indicate the concentration distributions observed immediately after ions were implanted under several different conditions; a solid line 130 denotes the concentration distribution of a completed apparatus. The axis of abscissa indicates the depth from the surface of the first region, the unit being μm; the axis of ordinates indicates the impurity concentration. The first buried channel is produced by a total of five ion implantations carried out in the first ion implantation process and the second ion implantation process. Hence, the distribution denoted by a dashed line 121 (acceleration energy level: 100 KeV; implant-dosage: $5 \times 10^{11}/cm^2$) and the distribution denoted by a dashed line 122 (acceleration energy level: 150 KeV; implant-dosage: $5 \times 10^{11}/cm^2$) are added to the distributions denoted by dashed lines 123, 124, and 125 of the first ion implantation process. These five distributions are merged to form the distribution shown by the solid line when the apparatus is completed.

A part denoted by 8a+9a is the first buried channel and it is the high-concentration region disposed on the low-concentration region. The surface concentration of the first buried channel (surface concentration of the high-concentration region) is about $6 \times 10^{16}/cm^3$, indicating that it is higher than the surface concentration $1 \times 10^{16}/cm^3$ of the second buried channel. Reference numeral 1 denotes the silicon substrate. The pn junction between the first buried channel and the silicon substrate 1 was located at approximately 1 μm. A result of the comparison with FIG. 6 revealed that the concentration distribution was the same at depth of 0.7 μm or more. This also proves that the high-concentration region 9a is disposed on the low-concentration region 8a.

From these facts, it is seen that the low-concentration region 8a maintains the same depth over the first buried channel and the second buried channel and the surface of the first buried channel is provided with a shallow high-concentration region 9a with a high impurity concentration which has been formed by the second ion implantation and heat treatment. The number of ion implantations, the acceleration energy level, and the implant-dosage are not limited those shown in this embodiment as long as they ensure good characteristics of the horizontal CCD and the vertical CCD.

(Embodiment 3)

FIGS. 8A through 8D are cross-sectional views illustrative of the manufacturing processes of an IR solid-state image sensing apparatus in accordance with the third embodiment of the present invention; they show the cross sections taken along a line corresponding to line XX—XX of FIG. 16. This embodiment corresponds to the manufacturing method in accordance with the fourth aspect of the present invention. A thin oxide film 2, which is 100 nm thick, was formed by thermal oxidation on a p-type (the first conducting type) silicon substrate (semiconductor substrate) 1 of an impurity concentration of $8 \times 10^{14}$ $cm^{-3}$. Then, a first resist pattern 3b was formed to cover the whole region except at open portions of the pattern corresponding to the first region 15 and the second region 16, where the first and second buried channels of the vertical and horizontal CCDs are to be produced, respectively.

In the next step, phosphorus was ion-implanted in the silicon substrate 1, using the first resist pattern 3b as the mask to produce a low-concentration region 8b which is common to the first and second buried channels. The conditions for ion implantation (4b) are as follows: the implant-dosage is $1.5 \times 10^{12}/cm^2$; and the acceleration energy is 160 KeV. Thus, a region 8b' (FIG. 8B), wherein the ions have been implanted, was formed on the surface of the silicon substrate 1. This ion implantation process is the first ion implantation process, which is illustrated in FIG. 8A.

The first resist pattern 3b was removed, then a second resist pattern 7b having open portions corresponding to the first region 15 was produced. In the following step, arsenic was ion-implanted, using the second resist pattern 7b as the mask to produce a high-concentration region 9b. The conditions for ion implantation (17b) are as follows: an implant-dosage of $1.8 \times 10^{12}/cm^2$; an acceleration energy level of 360 KeV. This ion implantation process is the second ion implantation process, which is illustrated in FIG. 8B. The ions used for the second ion implantation may be any second conducting type impurity as long as the diffusion coefficient thereof is smaller than that of phosphorus.

In the subsequent step, the second resist pattern 7b was removed prior to heat treatment performed at 1125° C. for 2.5 minutes in a nitrogen atmosphere in order to restore the crystallinity of the surface of the silicon substrate and also to activate the implanted ions. Then, using the publicly known LOCOS method, the device isolating region comprised of a channel cut 5 by p-type impurity diffusion and a thick oxide film 6 was produced. This state is shown in FIG. 8C. Thus, the low-concentration region 8b, which is common to the first buried channel and the second buried channel, and the high-concentration region 9b on the surface of the first buried channel were produced at the same time.

Then, predetermined processing was carried out to produce the transfer electrodes, namely, the transfer electrodes 10 through 12 of the vertical CCD and the transfer electrode 13 of the horizontal CCD. Poly-silicon was used for all the transfer electrodes 10 through 13. Then, a photoelectric converting section 18 was formed. The photoelectric converting section 18 was provided with the PtSi Schottky junction which converts infrared rays into signal charges. Lastly; a protective film 14 was formed to complete the IR solid-state image sensing apparatus in accordance with the present embodiment (FIG. 8D). SiO$_2$ produced by CVD was employed for the protective film 14.

(Embodiment 4)

Figure 9A:
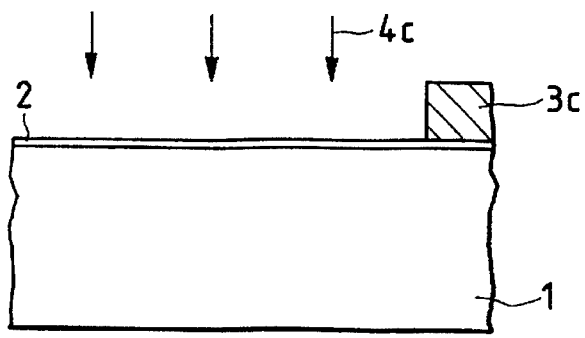
FIGS. 9A through 9D are cross-sectional views illustrative of the manufacturing processes of an IR solid-state image sensing apparatus in accordance with a fourth embodiment of the present invention.
Figure 9B:
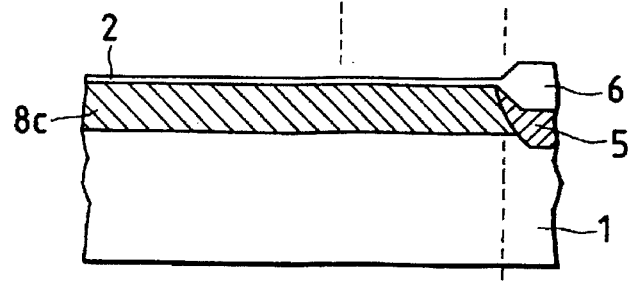
Figure 9C:
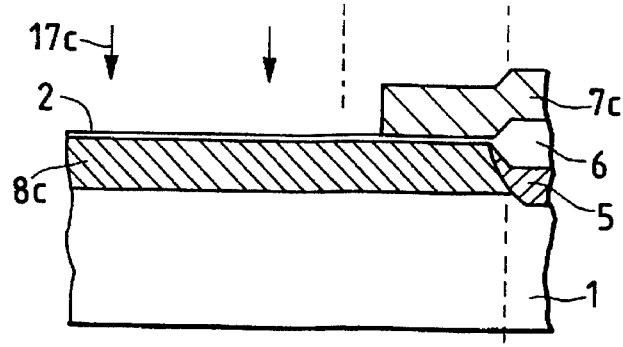
Figure 9D:
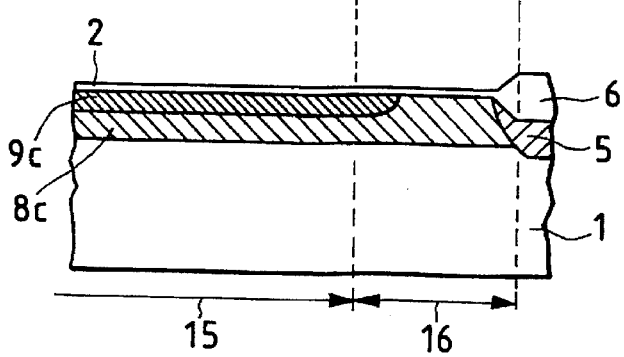
Figure 10:
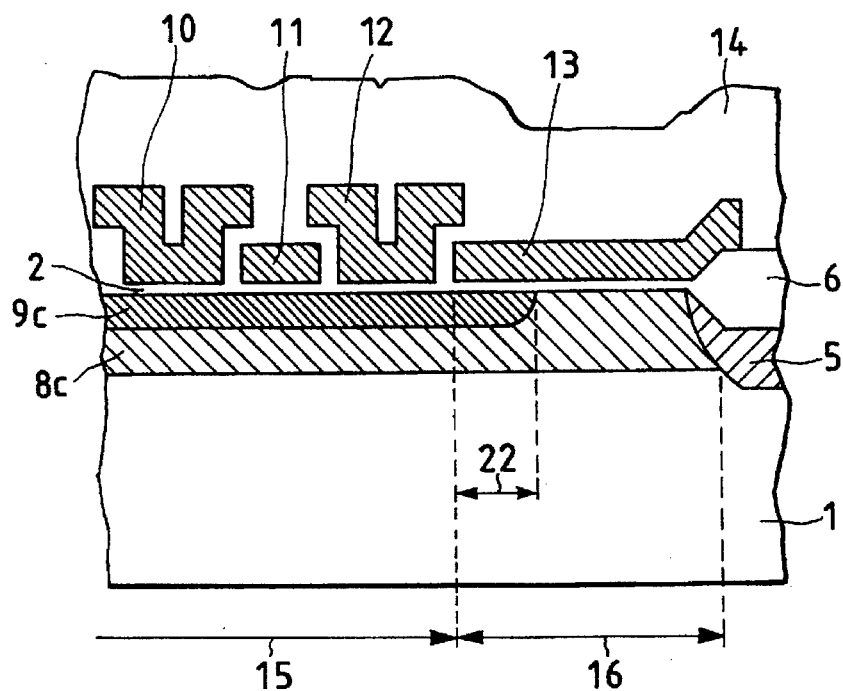
FIG. 10 is a cross-sectional view of a completed IR solid-state image sensing apparatus in accordance with the fourth embodiment.

FIGS. 9A through 9D are cross-sectional views illustrative of the manufacturing processes of an IR solid-state image sensing apparatus in accordance with the fourth embodiment of the present invention; FIG. 10 is the cross-sectional view of the apparatus which has been completed. These cross-sectional views show the cross sections taken along a line corresponding to line XX—XX of FIG. 16. This embodiment corresponds to the manufacturing method in accordance with the fifth aspect of the present invention. The thin oxide film 2, which is 500 nm thick, was formed by thermal oxidation on a p-type (the first conducting type) silicon substrate (semiconductor substrate) 1 of an impurity concentration of $8 \times 10^{14}$ cm$^{-3}$. Then, a first resist pattern 3c was formed to cover the whole region except at open portions of the pattern corresponding to the first region 15 and the second region 16, where the first and second buried channels of the vertical and horizontal CCDs are to be formed, respectively.

In the next step, phosphorus was ion-implanted in the silicon substrate 1, using the first resist pattern 3c as the mask to produce a low-concentration region 8c which is common to the first and second buried channels. The conditions for ion implantation (4c) are as follows: the implant-dosage is $1.5 \times 10^{12}$/cm$^2$; and the acceleration energy is 150 KeV. The phosphorus is an n-type (the second conducting type) impurity. This ion implantation process is the first ion implantation process, which is illustrated in FIG. 9A.

Further, the first resist pattern 3c was removed prior to heat treatment performed at 1125° C. for 30 minutes in a nitrogen atmosphere. This heat treatment formed the low-concentration region 8c. The diffusion depth of the low-concentration region 8c is increased by various types of heat treatment to be carried out after that. By using the publicly known LOCOS method, the device isolating region comprised of a channel cut 5 by the p-type impurity diffusion and a thick oxide film 6 was produced. This state is shown in FIG. 9B.

Then, a second resist pattern 7c having open portions corresponding to the first region and a part of the second region which is connected thereto is produced. In the following step, phosphorus was ion-implanted, using the second resist pattern 7c as the mask to produce a high-concentration region 9c. The conditions for ion implantation (17c) are as follows: the implant-dosage is $1.5 \times 10^{12}$/cm$^2$; and the acceleration energy is 150 KeV. The implanting quantity is not limited thereto; it may be a different quantity as long as the first region and the part of the second region have higher concentrations than the low-concentration region 8c. This ion implantation process is the second ion implantation process, which is illustrated in FIG. 9C.

In the next step, the second resist pattern 7c was removed prior to heat treatment performed at 1125° C. for 2.5 minutes in a nitrogen atmosphere in order to restore the crystallinity of the surface of the silicon substrate 1 and also to activate the implanted ions. This state is shown in FIG. 9D. Thus, the high-concentration region 9c is formed in the first region corresponding to the first buried channel and a part of the second region. A part of the high-concentration region 9c thus extends to the second buried channel. The extension length 22 (see FIG. 10) is set to 0.1 μm in design (on a reticle which is used for exposing photoresists); however, the actually measured value of the extension length 22 was 0.8 μm which is different from the design value, the difference being due to the alignment accuracy of an exposing apparatus and the lateral diffusion which takes place during the heat treatment.

Then, predetermined processing was carried out to produce the transfer electrodes, namely, the transfer electrodes 10 through 12 of the vertical CCD and the transfer electrode 13 of the horizontal CCD. Poly-silicon was used for all the transfer electrodes 10 through 13. Then, a photoelectric converting section 18 was formed. The photoelectric converting section 18 was provided with the PtSi Schottky junction which converts infrared rays into signal charges. Lastly, a protective film 14 was formed to complete the IR solid-state image sensing apparatus in accordance with the present embodiment (FIG. 10). SiO$_2$ produced by CVD was employed for the protective film 14. In the first ion implanting process and the second ion implanting process, a plurality of implantations may be carried out at different acceleration energy levels or ions of different diffusion constants may be used.

In the IR solid-state image sensing apparatus fabricated in the present embodiment, the diffusion depth of the low-concentration region 8c common to the first and second buried channels was about 1 μm, which is greater than the diffusion depth (approx. 0.6 μm) of the buried channel in the conventional room temperature visible solid-state image sensing apparatus. The surface concentration thereof was $1 \times 10^{16}$ cm$^{-3}$. In the high-concentration region 9c, the impurity concentration of the surface thereof was $1.6 \times 10^{16}$ cm$^{-3}$ and the diffusion depth was 0.6 μm.

(Embodiment 5)

Figure 12:
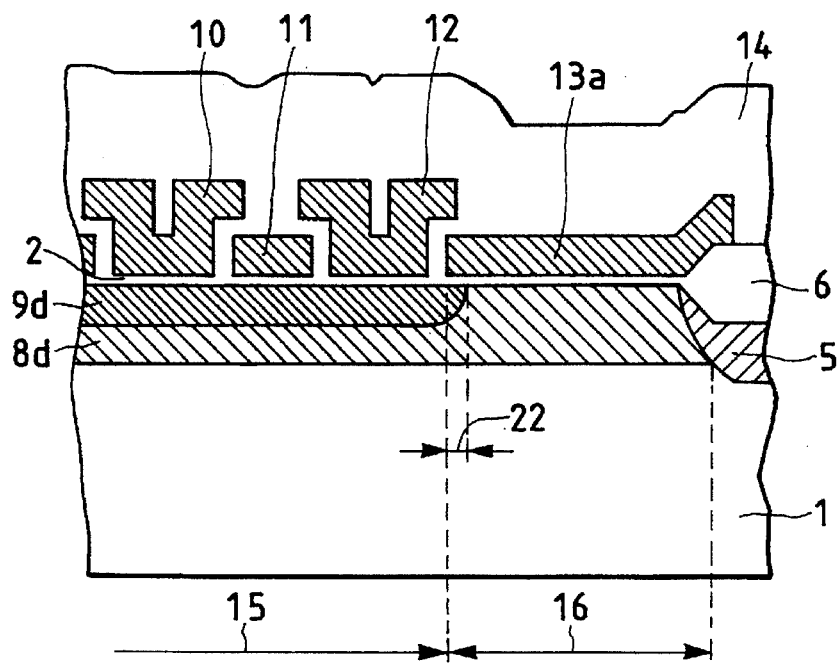
FIG. 12 is a cross-sectional view of a completed IR solid-state image sensing apparatus in accordance with the fifth embodiment.

FIGS. 11A through 11D are cross-sectional views illustrative of the manufacturing processes of an IR solid-state image sensing apparatus in accordance with the fifth embodiment of the present invention; FIG. 12 is the cross-sectional view of the apparatus which has been completed. These cross-sectional views show the cross sections taken along a line corresponding to line XX—XX of FIG. 16. This embodiment corresponds to the manufacturing method in accordance with the sixth aspect of the present invention.

The thin oxide film 2, which is 500 nm thick, was formed by thermal oxidation on the p-type (the first conducting type) silicon substrate (semiconductor substrate) 1 of an impurity concentration of $8\times10^{14}$ cm$^{-3}$. Then, a first resist pattern 3d was formed to cover the whole region except at open portions of the pattern corresponding to the first region 15 and the second region 16, where the first and second buried channels of the vertical and horizontal CCDs are to be produced, respectively.

Figure 11A:
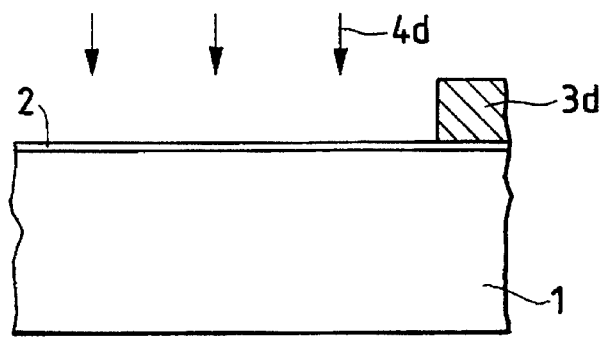
FIGS. 11A through 11D are cross-sectional views illustrative of the manufacturing processes of an IR solid-state image sensing apparatus in accordance with a fifth embodiment of the present invention.

In the next step, phosphorus was ion-implanted in the silicon substrate 1, using the first resist pattern 3d as the mask to produce a low-concentration region 8d which is common to the first and second buried channels. The conditions for ion implantation (4d) are as follows: the implant-dosage is $1.5\times10^{12}$/cm$^2$; and the acceleration energy is 150 KeV. This ion implantation process is the first ion implantation process, which is illustrated in FIG. 11A.

Figure 11B:
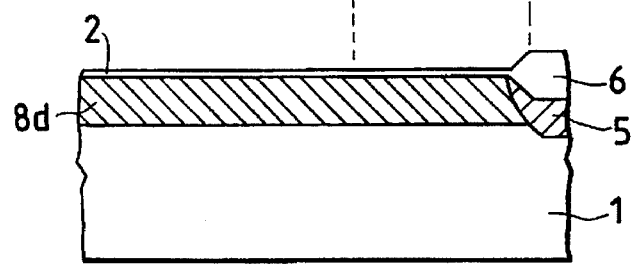

Further, the first resist pattern 3d was removed prior to heat treatment performed at 1125° C. for 30 minutes in a nitrogen atmosphere. This heat treatment forms the low-concentration region 8d. The diffusion depth of the low-concentration region 8d is increased by various types of heat treatment to be carried out after that. By using the publicly known LOCOS method, the device isolating region comprised of a channel cut 5 by the p-type impurity diffusion and a thick oxide film 6 was produced. This state is shown in FIG. 11B.

Figure 13:
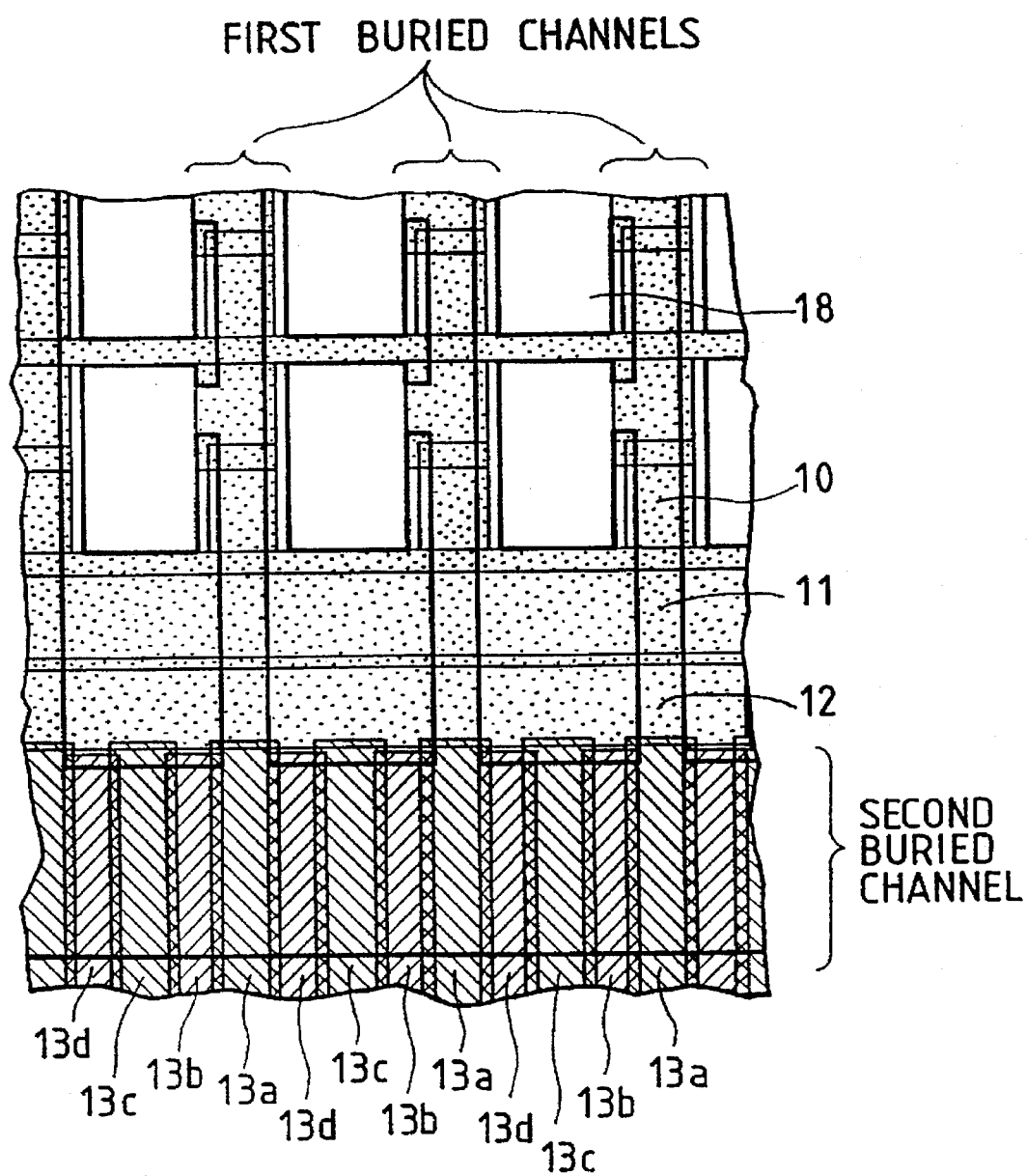
FIG. 13 is an enlarged top plan view of the horizontal and vertical CCDs in the completed IR solid-state image sensing apparatus in accordance with the fifth embodiment.

In the next step, transfer electrodes 13a, 13c (see FIG. 13 for 13c), which are made of poly-silicon, of the horizontal CCD were formed. Of the horizontal CCD transfer electrodes, 13a, 13b, 13c, and 13d, each transfer electrode 13a is disposed adjacently to a first buried channel, while the remaining transfer electrodes, namely, 13b, 13c, and 13d, are not. FIG. 13 shows the enlarged top plan view of the horizontal and vertical CCDs in the IR solid-state image sensing apparatus according to this embodiment. Reference numerals 13a, 13b, 13c, and 13d denote the transfer electrodes of the horizontal CCD; reference numerals 10, 11, and 12 denote the transfer electrodes of a vertical CCD. Of the transfer electrodes of the horizontal CCD, each transfer electrode 13a adjoins a first buried channel and it receives signal charges transferred from the vertical CCD and transfers them in the horizontal direction. The remaining transfer electrodes 13b, 13c, and 13d, function to transfer signal charges in the horizontal direction. In this embodiment, the horizontal CCD transfer electrode which adjoins a first buried channel is used also as the mask for self alignment in the second ion implantation process. Accordingly, in this case, at least each transfer electrode 13a has to be produced. Forming the transfer electrode 13c at the same time with the transfer electrode 13a simplifies the process.

Figure 11C:
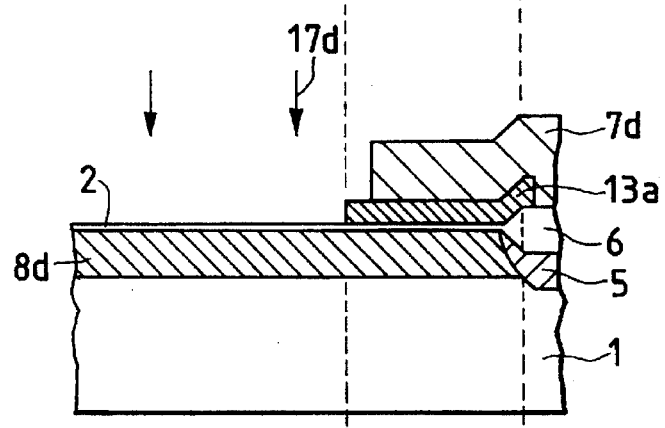

In the next step, a second resist pattern 7d was produced, the second resist pattern 7d having open areas corresponding to part of the horizontal CCD transfer electrodes 13a formed in the preceding process, and to the first region. Then, phosphorus was ion-implanted, using the second resist pattern 7d as the mask to produce a high-concentration region 9d. The conditions for ion implantation (17d) are as follows: the implant-dosage is $1.5\times10^{12}$/cm$^2$; and the acceleration energy is 150 KeV. The implant-dosage is not limited thereto; it may be different from the value shown above as long as the resulting concentration is higher than the low-concentration region 8d. This ion implantation process is the second ion implantation process, which is illustrated in FIG. 11C. Thus, the overlap between the horizontal CCD transfer electrode 13a and the high-concentration region 9d, i.e., the extension length 22, becomes the amount of the lateral diffusion obtained by the thermal diffusion to be implemented later.

Figure 11D:
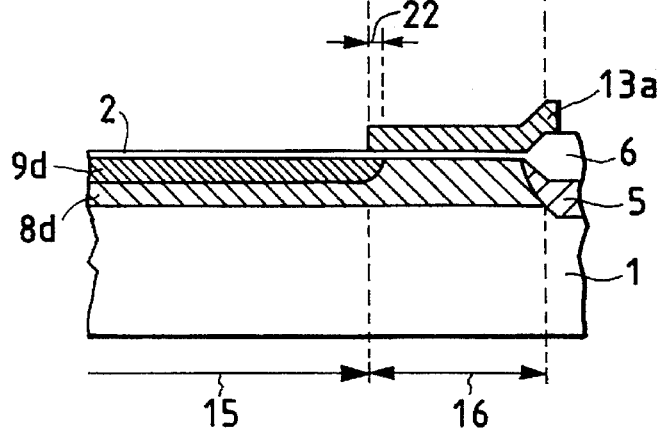

In the next step, the second resist pattern 7d was removed prior to heat treatment performed at 1125° C. for 2.5 minutes in a nitrogen atmosphere in order to restore the crystallinity of the surface of the silicon substrate and also to activate the implanted ions. This state is illustrated in FIG. 11D. Thus, the high-concentration region 9d has been formed on the first buried channel. The high-concentration region 9d extends to a part of the second buried channel; the extension length 22 is equivalent to the length of the lateral diffusion caused by the heat treatment. The actually measured length was 0.5 µm.

Then, predetermined processing was carried out to produce the transfer electrodes, namely, the transfer electrodes 10 through 12 of the vertical CCD and the transfer electrodes 13b and 13d of the horizontal CCD. Poly-silicon was used for all the transfer electrodes. Then, the photoelectric converting section 18 was formed. The photoelectric converting section 18 was provided with the PtSi Schottky junction which converts infrared rays into signal charges. Lastly, a protective film 14 was formed to complete the IR solid-state image sensing apparatus in accordance with the present embodiment (FIG. 12). SiO$_2$ produced by CVD was employed for the protective film 14. In the first ion implanting process and the second ion implanting process, a plurality of implantations may be carried out at different acceleration energy levels or ions of different diffusion constants may be used.

In the IR solid-state image sensing apparatus fabricated in the present embodiment, the diffusion depth of the low-concentration region 8d common to the first and second buried channels was about 1 µm, which is greater than the diffusion depth (approx. 0.6 µm) of the buried channel in the conventional room temperature visible solid-state image sensing apparatus. The surface concentration thereof was $1\times10^{16}$ cm$^{-3}$. In the high-concentration region 9d, the impurity concentration of the surface thereof was $1.6\times10^{16}$ cm$^{-3}$ and the diffusion depth was 0.6 µm.

(Embodiment 6)

Figure 14:
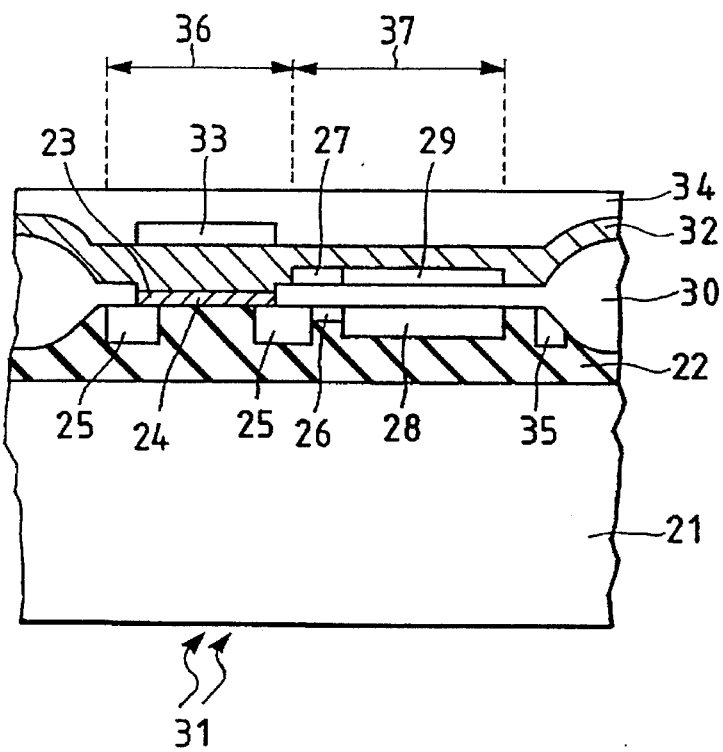
FIG. 14 is a cross-sectional view of an IR solid-state image sensing apparatus in accordance with a sixth embodiment.

FIG. 14 is a cross-sectional view of a Schottky junction photoreceptor and a charge reading section of an IR solid-state image sensing apparatus in accordance with the sixth embodiment. This embodiment corresponds to the infrared solid-state image sensing apparatus in accordance with the seventh aspect of the present invention.

A silicon epitaxial layer 22 was disposed on a p-type CZ silicon substrate 21 with a crystal orientation of <100>. The epitaxial layer 22 was grown by chemical evaporation (CVD) at a substrate temperature of 1170° C., with SiCl$_4$ as the material gas, B$_2$H$_6$ as the impurity material gas, and H$_2$ as the carrier gas. After completion of the apparatus, the thickness of the epitaxial layer 22 was 6 µm and the impurity concentration was $8\times10^{14}$ cm$^{-3}$. Provided on the epitaxial layer 22 were a Schottky junction photoreceptor 36 and a charge reading section 37. For the substrate, a semiconductor substrate such as a germanium substrate may be used in place of the silicon substrate.

The photoreceptor 36 is comprised of a Schottky junction 24 of the epitaxial layer 22 and a platinum silicide layer 23. The platinum silicide layer 23 was produced by depositing platinum onto the silicon substrate 21 by evaporation and heat treatment, thereby causing chemical reaction between the silicon and the platinum. This chemical processing also produced the Schottky junction 24 on the interface between the silicon epitaxial layer 25 and the platinum silicide layer 23. The platinum silicide converts an incident infrared ray 31 into a signal charge. The platinum silicide may be replaced by palladium silicide or iridium silicide. The Schottky junction 24 is usually surrounded by a guard ring 25 which controls the electric field intensity around the Schottky junction 24 to prevent leakage currents.

The charge reading section 37 was disposed on the epitaxial layer 22 adjoining the photoreceptor 36. This is a CCD constituted by impurity-diffused regions of a gate diffusion section 26 and a buried channel 28, and a transfer gate electrode 27 and transfer electrode 29 disposed thereon with a silicon oxide film 30 between. The gate diffusion section 26 was disposed adjacently to the guard ring 25, and the buried channel 28 was disposed adjacently to the gate diffusion section 26. Disposed on the gate diffusion section 26 and the buried channel 28 were the transfer gate electrode 27 and the transfer electrode 29, and the silicon oxide film 30 intervenes therebetween.

Phospho-silicate glass (PSG) produced by a CVD apparatus was disposed on the platinum silicide 23 as an interlayer insulating film 32; and further, a metallic reflecting film 33 based on an aluminum deposited film was disposed thereon to reflect infrared rays, which have been transmitted without being photoelectrically converted through the Schottky junction 24, and to direct them into the Schottky junction 24 again, thus improving the sensitivity. A channel stop 35 is provided to prevent signal charges from leaking.

Figure 17:
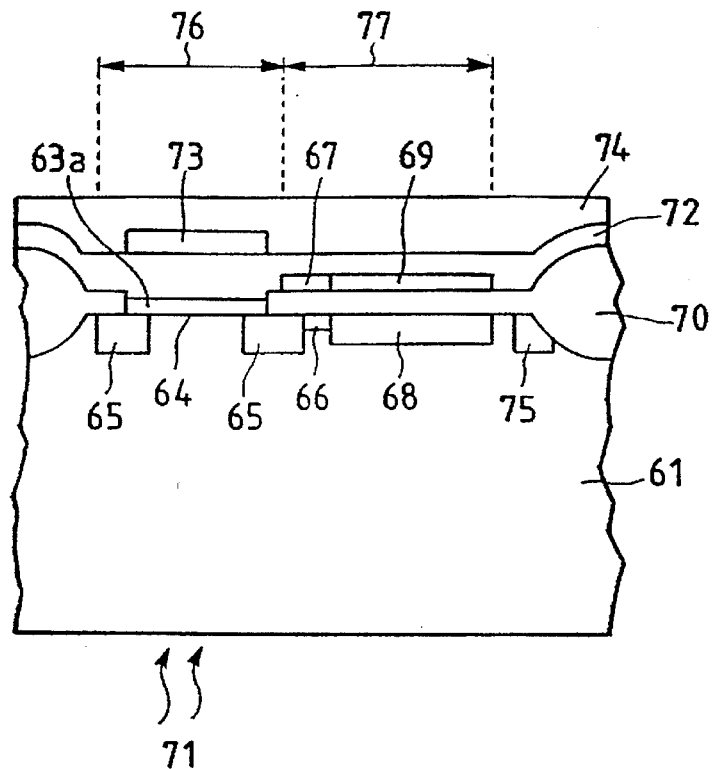
FIG. 17 is a cross-sectional view illustrative of a photoreceptor and a charge reading section of a conventional IR solid-state image sensing apparatus.
Figure 18:
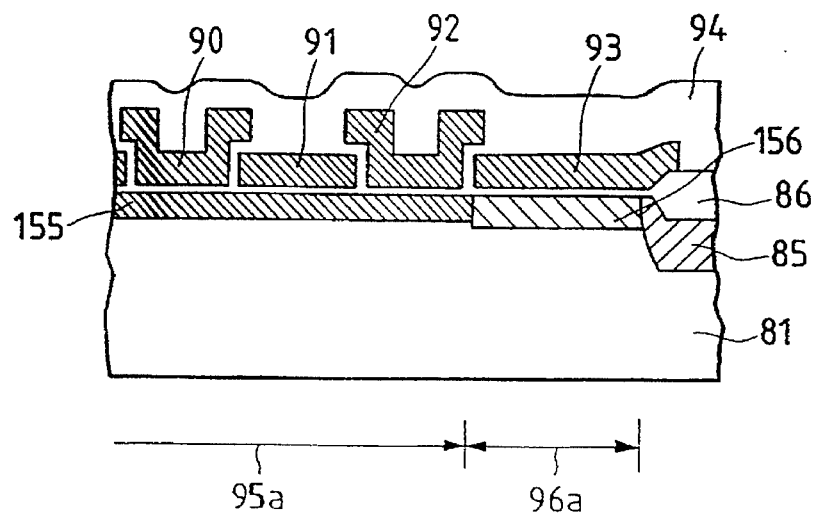
FIG. 18 is a cross-sectional view illustrative of a transfer section of a solid-state image sensing apparatus in accordance with the prior art.
Figure 19:
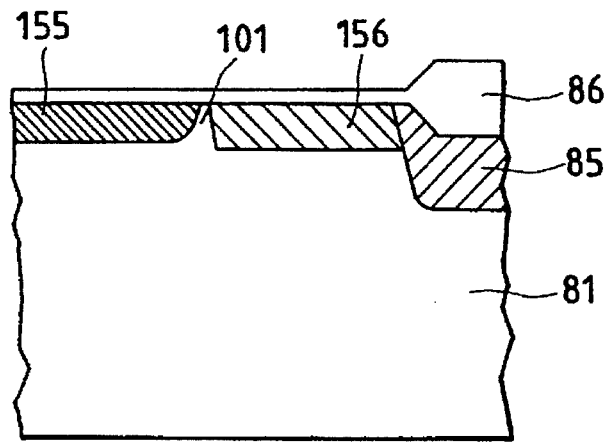
FIG. 19 is a cross-sectional view illustrative of a transfer section of a solid-state image sensing apparatus in accordance with the prior art.
Figure 20:
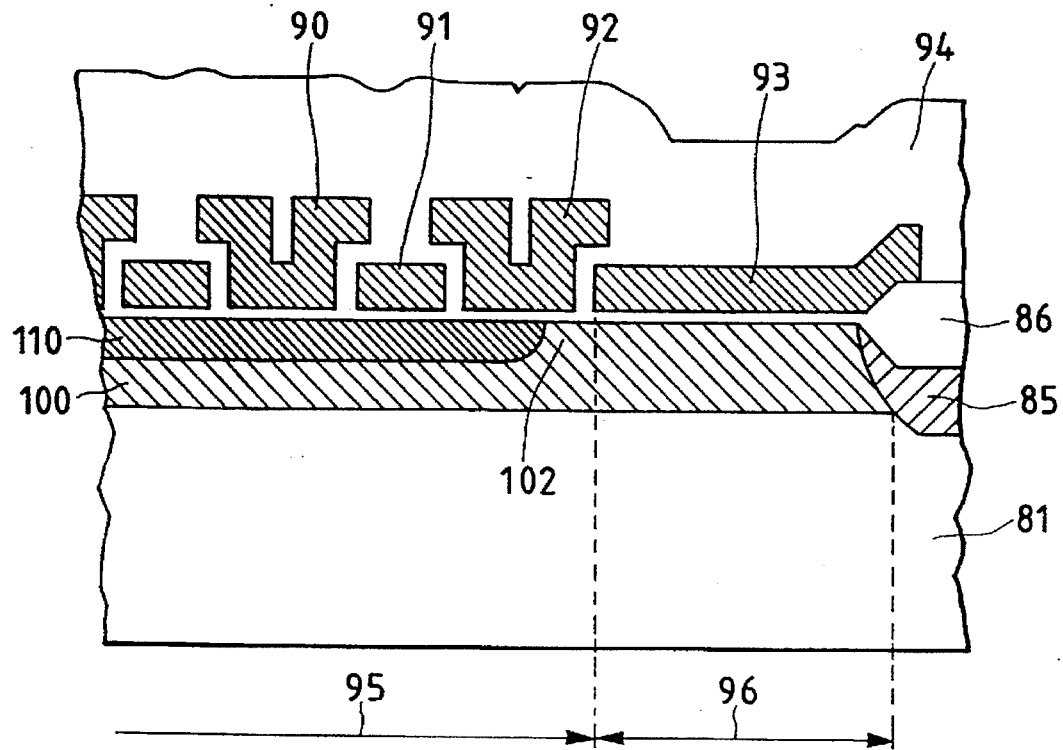
FIG. 20 is a cross-sectional view of an IR solid-state image sensing apparatus wherein transfer electrodes, which are formed after buried channels, have been shifted to the right in the drawing due to a manufacturing error.
Figure 21A:
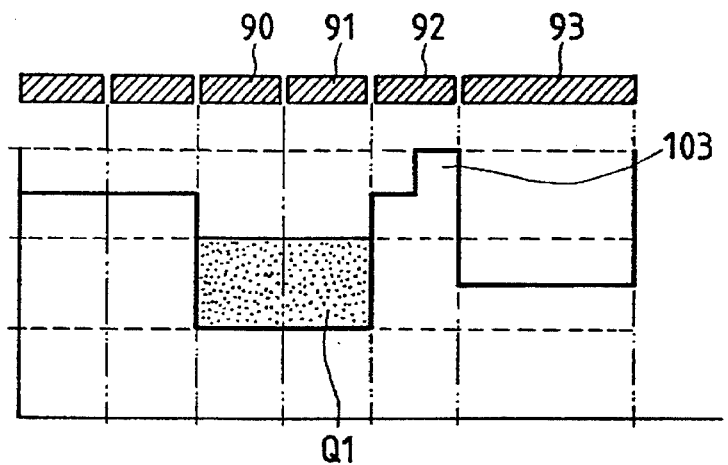
FIGS. 21A through 21C show potential states observed in the case illustrated in FIG. 20.
Figure 21B:
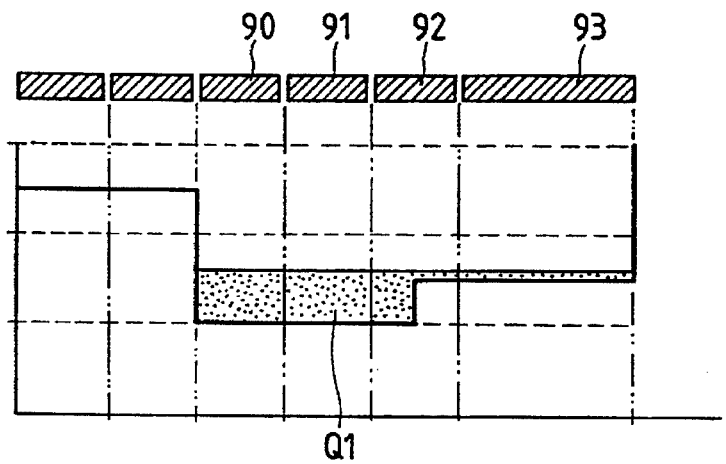
Figure 21C:
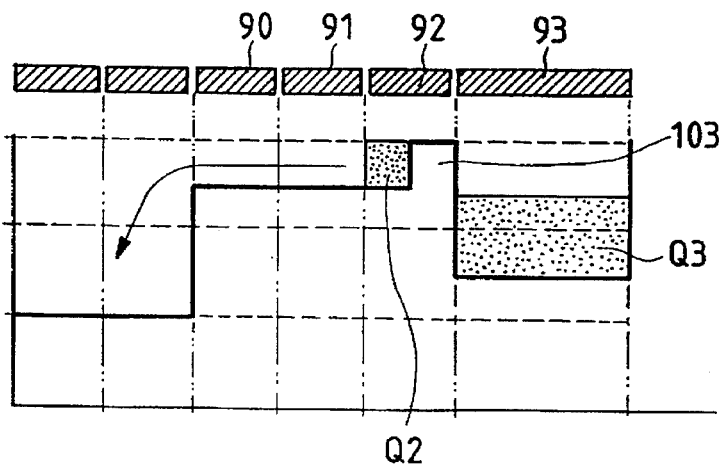
Figure 22:
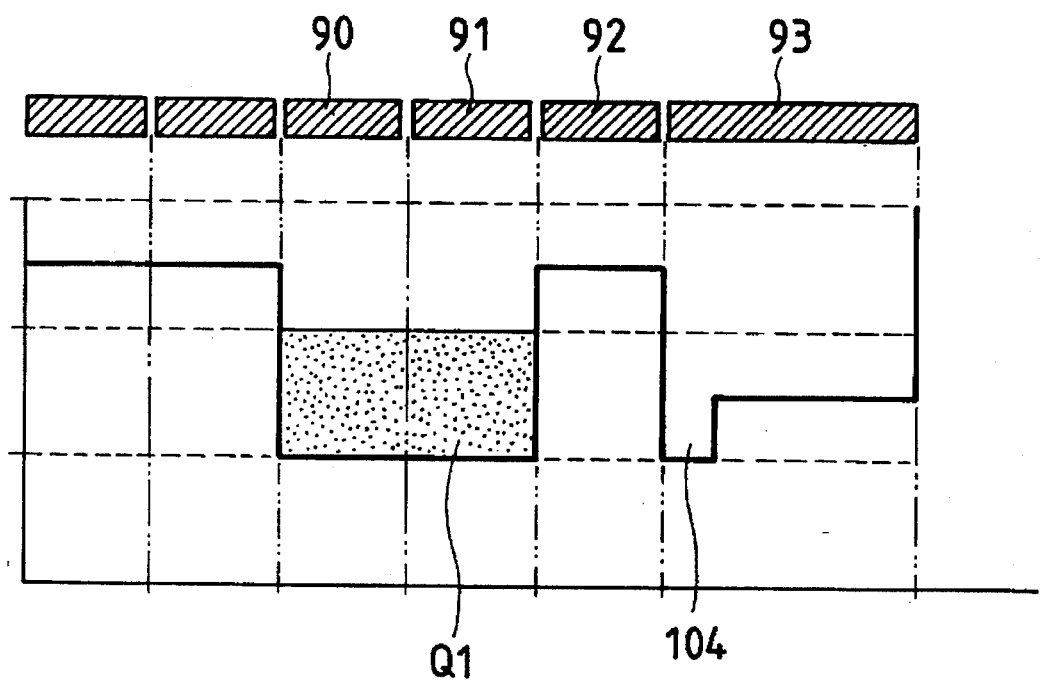
FIG. 22 shows a potential state observed when a large extension is given.

The sensitivity variation in the photoreceptors in the infrared solid-state image sensing apparatus made according to this embodiment and the conventional infrared solid-state image sensing apparatus shown in FIG. 17 were measured. In the conventional infrared solid-state image sensing apparatus, the sensitivity variation in the photoreceptors was 1%. In the infrared solid-state image sensing apparatus according to this embodiment, the sensitivity variation in the photoreceptors was 0.5%. The measurement was carried out by using a cold shield of F1.2 for the optical system and the measurement was performed in the vicinity of a 300K flat blackbody furnace. The shading (variation in irradiation) caused by the optical system was electrically eliminated by employing a 200 KHz high-pass filter.

In modifications of the sixth embodiment, the silicon epitaxial layer 22 was set to a thickness of 2 μm and to a thickness of 10 μm. In both modifications, the sensitivity variations were found to be identical to those in the case of the silicon epitaxial layer which is 6 μm thick.

(Embodiment 7)

FIGS. 15A through 15D are cross-sectional views illustrative of the manufacturing processes of an IR solid-state image sensing apparatus in accordance with the seventh embodiment of the present invention; they show the cross sections taken along a line corresponding to line XX—XX of FIG. 16. This embodiment corresponds to the manufacturing method in accordance with the eighth aspect of the present invention. A p-type epitaxial layer 41a was formed on a p-type (the first conducting type) silicon substrate (semiconductor substrate) 41 of an impurity concentration of $8 \times 10^{14}$ cm$^{-3}$. The epitaxial layer was 12 μm thick and had an impurity concentration of $8 \times 10^{14}$ cm$^{-3}$. Then, a thin oxide film 42 of 100 nm was formed on the epitaxial layer by thermal oxidation. Next, a first resist pattern 43 was formed to cover the whole region except at open portions of the pattern corresponding to a first region 55 and a second region 56, where the first and second buried channels of the vertical and horizontal CCDs are to be formed, respectively.

Figure 15A:
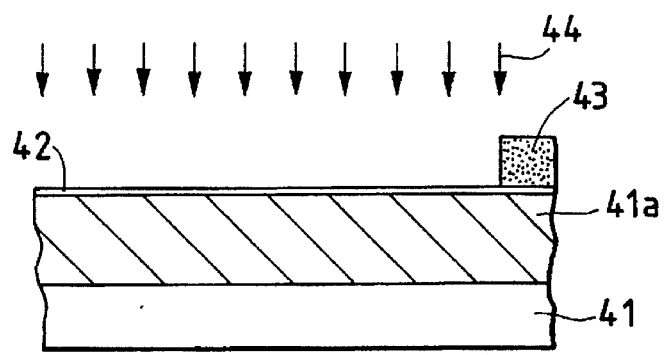
FIGS. 15A through 15D are cross-sectional views illustrative of the manufacturing processes of an IR solid-state image sensing apparatus in accordance with a seventh embodiment of the present invention.

In the next step, phosphorus was ion-implanted in the silicon substrate 41 having the epitaxial layer, using the first resist pattern 43 as the mask to produce a low-concentration region 48 which is common to the first and second buried channels. The conditions for ion implantation (44) are as follows: the implant-dosage is $1.5 \times 10^{12}$/cm$^2$; and the acceleration energy is 160 KeV. The phosphorus is an n-type (the second conducting type) impurity. This ion implantation process is the first ion implantation process, which is illustrated in FIG. 15A.

Figure 15B:
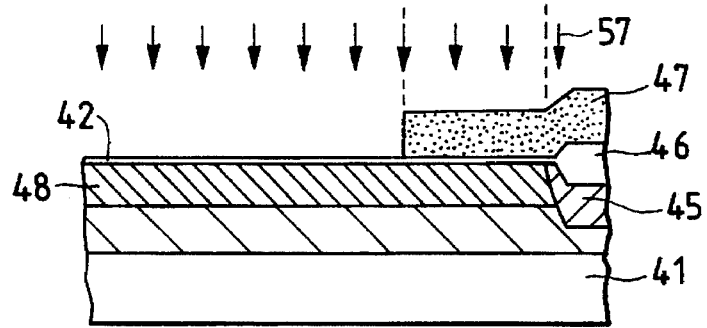

In the next step, the first resist pattern 43 was removed prior to heat treatment performed at 1125° C. for 30 minutes in a nitrogen atmosphere. This heat treatment forms the low-concentration region 48. The diffusion depth of the low-concentration region 48 is increased by various types of heat treatment to be carried out after that. Then, using the publicly known LOCOS method, a device isolating region comprised of a channel cut 45 by the p-type impurity diffusion and a thick oxide film 46 was produced. Then, a second resist pattern 47 having open portions corresponding to the first region 55 was produced. In the following step, phosphorus was ion-implanted, using the second resist pattern 47 as the mask to produce a high-concentration region 49. The conditions for ion implantation (57) are as follows: the implant-dosage is $1.5 \times 10^{12}$/cm$^2$; and the acceleration energy is 100 KeV. The implant-dosage is not limited thereto; it may be a different quantity as long as the surface of the first region 55 develops a concentration higher than that of the low-concentration region 48. This ion implantation process is the second ion implantation process, which is illustrated in FIG. 15B.

Figure 15C:
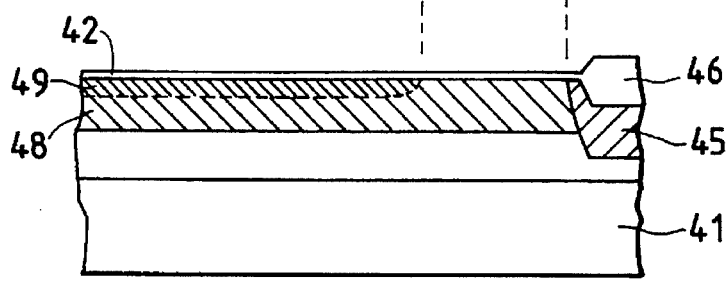
Figure 15D:
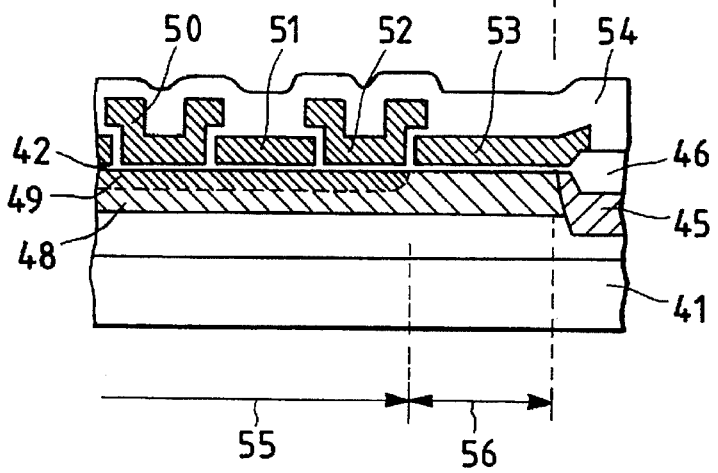

In the next step, the second resist pattern 47 was removed prior to heat treatment performed at 1125° C. for 2.5 minutes in the nitrogen atmosphere in order to restore the crystallinity of the surface of the silicon substrate 41 and also to activate the implanted ions. This state is illustrated in FIG. 15C. Thus, the high-concentration region 49 is formed on the surface portion of the first region 55 which corresponds to the first buried channel. Then, predetermined processing was carried out to produce the transfer electrodes, namely, transfer electrodes 50 through 52 of the vertical CCD and a transfer electrode 53 of the horizontal CCD. Poly-silicon was used for all the transfer electrodes 50 through 53. Then, a photoelectric converting section 18 (FIG. 16) was formed. The photoelectric converting section 18 was provided with a PtSi Schottky junction which converts infrared rays into signal charges. Lastly, a protective film 54 was formed to complete the IR solid-state image sensing apparatus in accordance with the present embodiment (FIG. 15D). SiO$_2$ produced by chemical evaporation (CVD) was employed for the protective film 54.

Having described preferred embodiments of the present invention, it is to be understood that many variations will occur to those skilled in the art within the scope of the appended claims.

What is claimed is:

1. An infrared solid-state image sensing apparatus, comprising:
   a plurality of photoelectric converting sections arranged vertically and horizontally in a matrix pattern on a semiconductor substrate of a first conducting type;
   a plurality of vertical CCDs which have first buried channels of a second conducting type and electrodes disposed thereon with insulating film between and which are disposed adjacently to said photoelectric converting sections; and
   a horizontal CCD which has a second buried channel of the second conducting type and an electrode disposed thereon with insulating film between and which is disposed adjacently to one side of said vertical CCDs;

said first and second buried channels being provided with a low-concentration region of uniform diffusion depth, and a surface of each first buried channel being provided with a high-concentration region of the second conducting type which has a higher concentration than that of a surface of the second buried channel.

2. An infrared solid-state image sensing apparatus according to claim 1, wherein a diffusion depth of said low-concentration region is from 0.8 μm to 1.5 μm.

3. An infrared solid-state image sensing apparatus according to claim 1, wherein the low-concentration region of said first and second buried channels is formed by ion implantation carried out a plurality of times.

4. An infrared solid-state image sensing apparatus according to claim 1, wherein said high-concentration region is formed by ion implantation carried out a plurality of times.

5. An infrared solid-state image sensing apparatus according to claim 2, wherein said high-concentration region overlaps to a part of said second buried channel.

6. An infrared solid-state image sensing apparatus according to claim 5, wherein a length of overlap of said high-concentration region with said second buried channel is equal to a length of lateral diffusion produced by a thermal diffusion method.

7. An infrared solid-state image sensing apparatus, comprising:

a plurality of Schottky junction photoreceptors, which are disposed in a matrix pattern on a semiconductor substrate and which produce signal charges by photoelectrically converting infrared rays; and a charge reading section which adjoins said photoreceptors and which transfers the signal charges;

said semiconductor substrate having an epitaxial layer thereon with the same conductivity type and impurity concentration as said semiconductor substrate, and said Schottky junction receptors being disposed on said epitaxial layer.

8. An infrared solid-state image sensing apparatus according to claim 7, wherein said semiconductor substrate is a silicon said epitaxial layer is a silicon epitaxial layer, substrate and said Schottky junction photoreceptors include Schottky junctions of said silicon epitaxial layer, which is disposed on said silicon substrate, and a metal silicide layer.

9. An infrared solid-state image sensing apparatus according to claim 8, wherein said metallic silicide layer is a platinum silicide layer.

10. An infrared solid-state image sensing apparatus according to claim 9, wherein said epitaxial layer is from 1 μm to 30 μm in thickness.

11. An infrared solid-state image sensing apparatus according to claim 10, wherein said charge reading section includes a charge coupled device or a charge sweep device.

12. An infrared solid-state image sensing apparatus, comprising:

a semiconductor substrate including a semiconductor of a first conducting type upon which an epitaxial layer of the first conducting type is disposed;

a plurality of photoelectric converting sections arranged vertically and horizontally in a matrix pattern on said epitaxial layer;

a plurality of vertical CCDs which have first buried channels of a second conducting type formed on said epitaxial layer and electrodes disposed thereon with insulating film between, and which are disposed adjacently to said photoelectric converting sections; and a horizontal CCD which has a second buried channel of the second conducting type formed on said epitaxial layer and an electrode disposed thereon with insulating film between, and which is disposed adjacently to one side of said vertical CCDs;

said first and second buried channels being provided with a low-concentration region of uniform diffusion depth, and a surface of each first buried channel being provided with a high-concentration region of the second conducting type which has a higher concentration than that of a surface of the second buried channel.

13. An infrared solid-state image sensing apparatus according to claim 12, wherein the diffusion depth of said low-concentration region is from 0.8 μm to 1.5 μm.

14. An infrared solid-state image sensing apparatus according to claim 12, wherein the low-concentration region of said first and second buried channels is formed by ion implantation carried out a plurality of times.

15. An infrared solid-state image sensing apparatus according to claim 12, wherein said high-concentration region is formed by ion implantation carried out a plurality of times.

16. An infrared solid-state image sensing apparatus according to claim 13, wherein said high-concentration region extends overlaps a part of said second buried channel.

17. An infrared solid-state image sensing apparatus according to claim 16, wherein a length of overlap of said high-concentration region with said second buried channel is equal to a length of lateral diffusion produced by a thermal diffusion method.

* * * * *